United States Patent [19]

Yamaguchi et al.

[11] Patent Number: 5,365,535
[45] Date of Patent: Nov. 15, 1994

[54] SEMICONDUCTOR LASER AND BEAM SPLITTING DEVICES, AND OPTICAL INFORMATION RECORDING/REPRODUCING, OPTICAL COMMUNICATION, AND OPTOMAGNETIC RECORDING/REPRODUCING APPARATUSES USING SEMICONDUCTOR LASER AND BEAM SPLITTING DEVICES

[75] Inventors: Eiji Yamaguchi, Zama; Hiroaki Hoshi, Yokohama; Masakuni Yamamoto, Yamato; Sotomitsu Ikeda, Atsugi, all of Japan

[73] Assignee: Canon Kabushiki Kaisha, Tokyo, Japan

[21] Appl. No.: 3,316

[22] Filed: Jan. 12, 1993

[30] Foreign Application Priority Data

| Jan. 13, 1992 | [JP] | Japan | 4-021579 |
| Mar. 19, 1992 | [JP] | Japan | 4-092312 |
| Aug. 21, 1992 | [JP] | Japan | 4-244043 |

[51] Int. Cl.$^5$ .............................................. H01S 3/00
[52] U.S. Cl. ......................................... 372/38; 369/121
[58] Field of Search .................... 372/38, 43, 44, 50, 372/23; 369/49, 121, 124, 131, 44.12

[56] References Cited

U.S. PATENT DOCUMENTS 4,982,408  1/1991  Shimizu .
5,060,212  10/1991  Fujita et al. ................ 369/44.12

FOREIGN PATENT DOCUMENTS 38-211787  9/1963  Japan .
3268252  11/1991  Japan .
4291045  10/1992  Japan .

OTHER PUBLICATIONS

ISOM "911, International Symposium on Optical Memory 1991 Technical Digest," High-Speed Magneto-Optic Drive With Overwriting and Read-Verifying Functions, by Akinori Watabe, et al., Oct. 1–4, 1991, pp. 127 and 128.

*Primary Examiner*—Rodney B. Bovernick
*Assistant Examiner*—Robert E. Wise
*Attorney, Agent, or Firm*—Fitzpatrick, Cella, Harper & Scinto

[57] ABSTRACT

A semiconductor laser device includes a semiconductor laser, a signal generating circuit, a modulation circuit and a drive circuit. The semiconductor laser has an active layer including at least two light-emitting layers having different energy levels. A high-frequency signal having a predetermined frequency is generated by the signal generating circuit. The signal width of the high-frequency signal is modulated by the modulation circuit in accordance with an information signal. The semiconductor laser is driven by the drive circuit in accordance with the signal modulated by the modulation circuit.

22 Claims, 22 Drawing Sheets

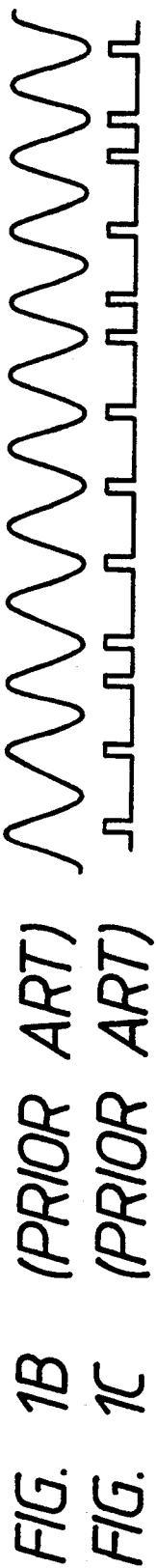
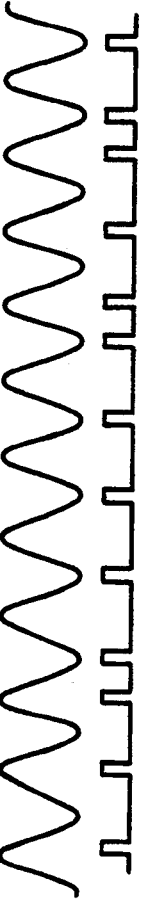
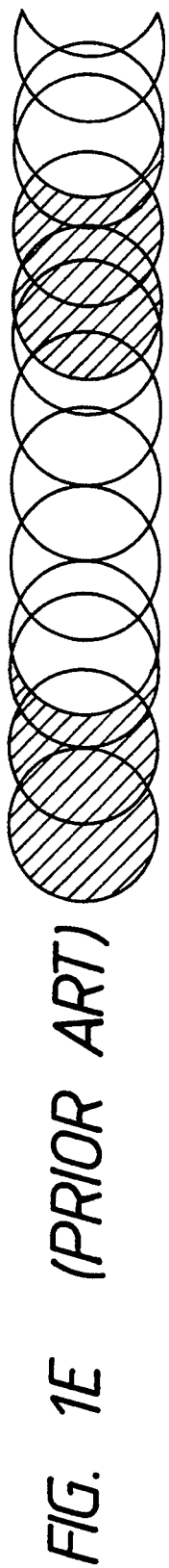
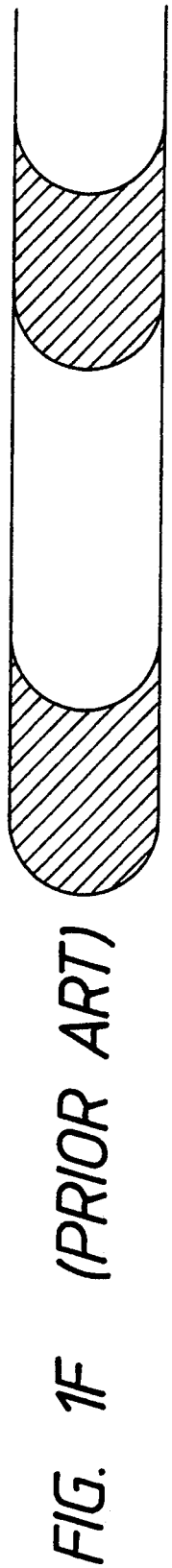
FIG. 1A (PRIOR ART)
FIG. 1B (PRIOR ART)
FIG. 1C (PRIOR ART)
FIG. 1D (PRIOR ART)
FIG. 1E (PRIOR ART)
FIG. 1F (PRIOR ART)

MOVING DIRECTION
OF LIGHT SPOT

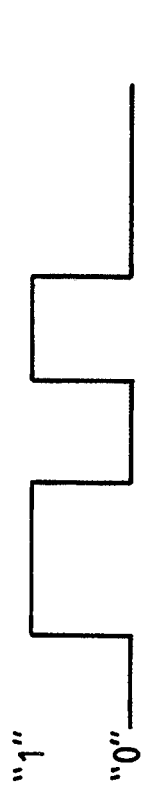
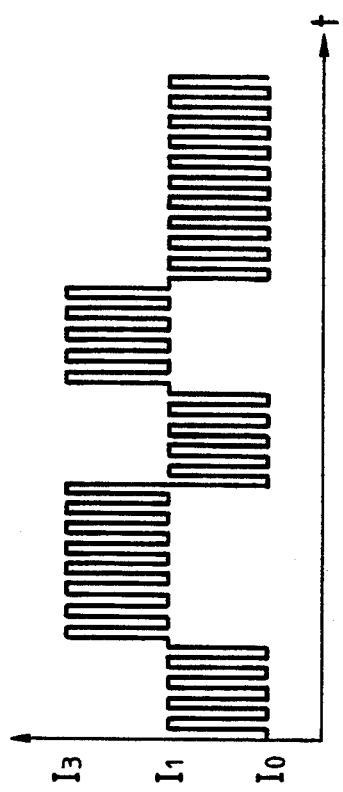
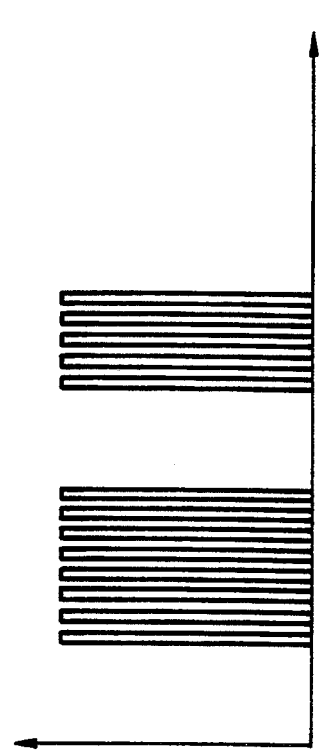
FIG. 7A RECORDING SIGNAL
FIG. 7B DRIVE CURRENT
FIG. 7C $\lambda_1$ LIGHT OUTPUT (REPRODUCTION POWER)
FIG. 7D $\lambda_2$ LIGHT OUTPUT (RECORDING POWER)

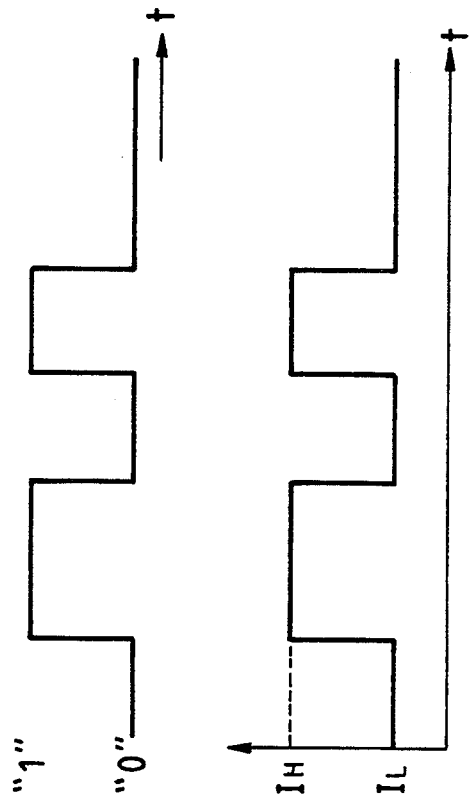
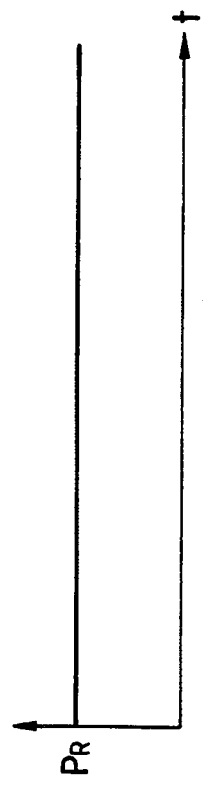
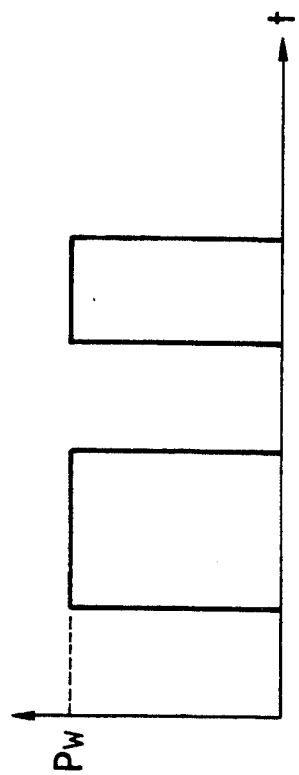
FIG. 11A  RECORDING SIGNAL
FIG. 11B  DRIVE CURRENT
FIG. 11C  λ₁ LIGHT OUTPUT (REPRODUCTION POWER)
FIG. 11D  λ₂ LIGHT OUTPUT (RECORDING POWER)

FIG. 14A DATA
FIG. 14B HIGH FREQUENCY
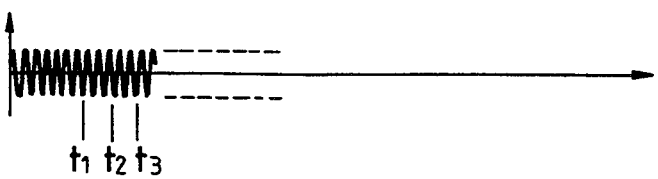
FIG. 14C INJECTION CURRENT
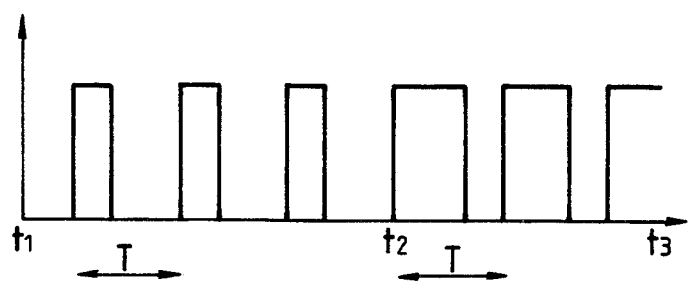
FIG. 14D λ₂ LIGHT OUTPUT
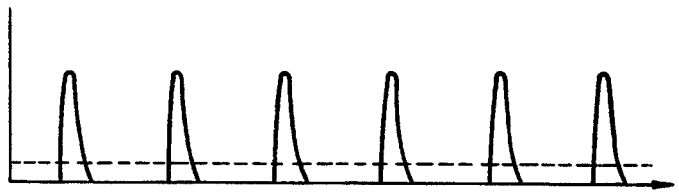
FIG. 14E λ₁ LIGHT OUTPUT

FIG. 21A  REFERENCE CLOCK

FIG. 21B  A.C. MAGNETIC FIELD  POSITIVE / NEGATIVE

FIG. 21C  TIMING PIT DETECTION SIGNAL

FIG. 21D  LASER PULSE OF SEMICONDUCTOR LASER 51a (MODULATION SIGNAL)  1 0 0 0 0 1 0 0 0 0 0 0 0 1 0 0 0 0 0 0 0 0 1 0

FIG. 21E  LASER PULSE OF SEMICONDUCTOR LASER 51b (MODULATION SIGNAL)  1 0 0 0 0 0 0 1 0 0 0 0 0 0 0 1 0 0 0 0 0 1 0 0

FIG. 21F  LASER PULSE OF SEMICONDUCTOR LASER 51c (MODULATION SIGNAL)  1 0 0 0 0 0 0 0 0 1 0 0 0 0 0 1 0 0 0 0 0 0 1 0

FIG. 21G  RECORDING PATTERN OF SEMICONDUCTOR LASER 51a

FIG. 21H  RECORDING PATTERN OF SEMICONDUCTOR LASER 51b

FIG. 21I  RECORDING PATTERN OF SEMICONDUCTOR LASER 51c

SEMICONDUCTOR LASER AND BEAM SPLITTING DEVICES, AND OPTICAL INFORMATION RECORDING/REPRODUCING, OPTICAL COMMUNICATION, AND OPTOMAGNETIC RECORDING/REPRODUCING APPARATUSES USING SEMICONDUCTOR LASER AND BEAM SPLITTING DEVICES

BACKGROUND OF THE INVENTION

1. Field of the Invention

The present invention relates to semiconductor laser and beam splitting devices, and optical recording/reproducing, optical communication, and optomagnetic recording/reproducing apparatuses using the semiconductor laser and beam splitting devices, the optomagnetic recording/reproducing apparatus being adapted to optomagnetically record or reproduce information.

2. Related Background Art

In recent years, remarkable technological developments have been made in the fields of optical communication and optical information processing, and the most advanced variable wavelength performance has become increasingly important as a function required in semiconductor lasers in wavelength multiplex transmission and frequency modulation transmission methods for widening the transmission bands in communication fields so as to achieve higher-density recording by wavelength multiplexing in the field of optical recording. In these technical fields, the density of information is increased in terms of time and space by utilizing multiplexing and parallel characteristics of light wavelengths. The present applicant has proposed the following semiconductor laser and its driving method so as to achieve most advanced variable wavelength control. More specifically, as disclosed in Japanese Laid-Open Patent Application No. 63-211787 (corresponding U.S. Pat. No. 4,982,408), an active layer comprises a plurality of quantum well layers having different quantum levels, and the magnitude of injection currents into these quantum well layers are changed to variably control an oscillation frequency.

Technological advances in an optical information recording/reproducing apparatus for recording or reproducing information using such a semiconductor laser have been achieved to a remarkable extent. In particular, a recording/reproducing apparatus using an optomagnetic recording medium or a phase change recording medium is expected to be the most promising future apparatus because it can erase or update information and the recording capacity can be made larger. In such a recording/reproducing apparatus, studies on "overwrite" operations of information to increase a data transfer speed, "direct verifying" operations of recorded information, and "parallel recording/reproduction" (reproduction simultaneously with recording) using a plurality of light spots have been extensively made.

Overwrite methods for optomagnetic recording media are mainly classified into a magnetic field modulation method and an optical modulation method. The magnetic field modulation method is a method for applying a bias magnetic field modulated in accordance with recording information while a recording medium is being irradiated with a laser beam having a predetermined intensity. On the other hand, the optical modulation method is a method for generating a laser beam intensity-modulated in accordance with recording information on a recording medium to record the information while a predetermined magnetic field is being applied to the recording medium. In recent years, another overwrite method is proposed in which a recording medium is irradiated with a pulsed laser beam while an A.C. magnetic field having a predetermined frequency is being applied to the recording medium. FIGS. 1A to 1F are timing charts for explaining a recording operation using the above recording method. FIG. 1A shows a reference clock, FIG. 1B shows an A.C. magnetic field, and FIG. 1C shows a pulsed laser beam. In this recording method, the A.C. magnetic field synchronized with the reference clock is applied to the recording medium, and a laser beam is projected on the recording medium in synchronism with positive and negative peak positions of this A.C. magnetic field. In this case, the laser beam is projected at the positive or negative peak position of the A.C. magnetic field on the basis of a signal modulated with a recording signal shown in FIG. 1D. By these operations, the direction of magnetization of a temperature rise portion of the recording medium is aligned with a direction corresponding to the recording signal, thereby forming the domains shown in FIG. 1E. The shape of each domain formed is a shape of an arrow feather, as shown in FIG. 1F. Note that an overwrite method for generating light beams having high and low powers modulated in accordance with recording information is available as an overwrite method for a phase change recording medium.

On the other hand, as a direct verifying scheme, for example, two light spots are formed on the same information track at two adjacent timings, information is recorded with the leading light spot, and the recorded information is reproduced with the trailing beam spot, thereby performing a verifying operation. The two beam spots may be formed using one optical head or two optical heads. The parallel recording/reproducing methods include a method (ISOM '91, Lecture No. 3G-1) using an image rotating element (image rotator) to scan the target tracks with four light spots and a method for recording information in a plurality of information tracks with an A.C. magnetic field and light pulses, as proposed in Japanese Laid-Open Patent Application No. 4-291045.

In the above conventional direct verifying method, when two light spots, i.e., the recording and reproduction light spots, are to be formed, two separate semiconductor lasers are used as light sources or a semiconductor laser array is used to form the recording and reproduction light spots. For this reason, it is very difficult to adjust the positions of the two light spots, i.e., an optical system. When the semiconductor laser array is used, an element distance cannot be detected due to thermal interference between the semiconductor laser elements. For this reason, the two light spots cannot be set closer to each other, and sufficient performance of the optical system cannot be obtained, resulting in inconvenience.

In the parallel recording or recording using a light pulse modulated with a magnetic field, the recorded information must be reproduced and verified, thus prolonging the recording time. In addition, in parallel recording and reproduction using a plurality of light spots, a stable tracking control scheme has not been yet established. In addition, in direct verifying upon radiation of recording and verifying light spots on the corresponding information tracks, any tracking control scheme for stably scanning one information track with two light spots has not been yet established.

In the direct verifying operation using two light spots formed by one optical head, the curvature of an inner track of the information recording disk is different from that of an outer track thereof, tracking accuracy varies depending on the position on the disk, and verifying accuracy is also degraded depending on the position on the disk. In the formation of two light spots by two optical heads, since the two optical heads radiate linearly polarized light components on the disk, these light components are susceptible to the influence of the birefringence of the disk substrate. In addition, the light spots must be accurately radially moved on the disk in the radial seek operation, thereby limiting structural freedom in design and hence keeping an optical system from being made compactly.

SUMMARY OF THE INVENTION

It is an object of the present invention to provide a semiconductor laser device capable of obtaining a light output having a better SN ratio with minimum crosstalk components by driving a semiconductor laser utilizing dynamic switching characteristics of an oscillation wavelength, and optical information recording/reproducing and optical communication apparatuses using such semiconductor laser devices.

It is another object of the present invention to provide an optical information recording apparatus capable of performing a direct verifying operation using one semiconductor laser, and a method of driving the semiconductor laser used in this apparatus.

It is still another object of the present invention to provide an optomagnetic recording/reproducing apparatus almost free from the birefringence of a disk substrate and structural limitations on an optical system, thereby providing a compact optical system.

It is still another object of the present invention to provide a beam splitting device for reducing crosstalk components between a plurality of light beams having different wavelengths and an optical information recording/reproducing apparatus using the beam splitting device.

According to an aspect of the present invention, there is provided a semiconductor laser device comprising:
  a semiconductor laser having an active layer consisting of at least two light-emitting layers having different energy levels;
  a signal generating circuit for generating a high-frequency signal having a predetermined frequency;
  a modulation circuit for modulating a signal width of the high-frequency signal generated by the signal generating circuit, in accordance with an information signal; and
  a drive circuit for driving the semiconductor laser in accordance with the signal modulated by the modulation circuit.

According to another aspect of the present invention, there is provided an optical information recording/reproducing apparatus comprising:
  a semiconductor laser, having an active layer consisting of at least two light-emitting layers having different energy levels, for generating first and second light beams having different wavelengths;
  a wavelength dispersion element for dispersing the first and second light beams generated by the semiconductor laser; and
  an optical system for converging the first and second light beams dispersed by the wavelength dispersion element to form first and second light spots on a track of a recording medium at a predetermined interval,
  wherein information is recorded on the track with the first light spot, and at the same time the information recorded on the track is reproduced with the second light spot.

According to still another aspect of the present invention, there is provided an optical information recording/reproducing apparatus comprising:
  a semiconductor laser, having an active layer consisting of at least two light-emitting layers having different energy levels, for generating first and second light beams having different wavelengths;
  a signal generating circuit for generating a high-frequency signal having a predetermined frequency;
  a modulation circuit for modulating a signal width of the high-frequency signal generated by the signal generation circuit, in accordance with an information signal;
  a drive circuit for driving the semiconductor laser with the signal modulated by the modulation circuit;
  a wavelength dispersion element for dispersing the first and second light beams generated by the semiconductor laser; and
  an optical system for converging the first and second light beams dispersed by the wavelength dispersion element to form first and second light spots on a track of a recording medium at a predetermined interval,
  wherein information is recorded on the track with the first light spot, and at the same time the information recorded on the track is reproduced with the second light spot.

According to still another aspect of the present invention, there is provided an optical information recording/reproducing apparatus comprising:
  a semiconductor laser, having an active layer consisting of at least two light-emitting layers having different energy levels, for generating first and second light beams having different wavelengths;
  an optical element having a stepped edge for splitting the first and second light beams generated by the semiconductor laser, the optical element causing a difference between an optical path of light passing through one side of the edge and an optical path of light passing through the other side of the edge, and the difference being almost ½ one of the wavelengths of the first and second light beams and being an almost integer multiple of the other of the wavelengths; and
  an optical system for converging the first and second light beams dispersed by the optical element to form first and second light spots on a track of a recording medium at a predetermined interval,
  wherein information is recorded on the track with the first light spot, and at the same time the information recorded on the track is reproduced with the second light spot.

According to still another aspect of the present invention, there is provided an optical communication apparatus comprising:
  a semiconductor laser, having an active layer consisting of at least two light-emitting layers having different energy levels, for generating first and second light beams having different wavelengths;

a signal generating circuit for generating a high-frequency signal having a predetermined frequency;

a modulation circuit for modulating a signal width of the high-frequency signal generated by the signal generating circuit, in accordance with an information signal;

a drive circuit for driving the semiconductor laser in accordance with the signal modulated by the modulation circuit, the semiconductor laser being driven by the drive circuit to generate a first light beam modulated by an information signal and a second light beam modulated at a predetermined period, and the first and second light beams having different wavelengths;

a transmission line for transmitting the first and second light beams;

first and second sensors for respectively detecting the first and second light beams transmitted through the transmission line;

a clock generating circuit for generating a reference clock on the basis of an output signal from the second sensor; and a demodulation circuit for demodulating the information signal from an output signal from the first sensor, in synchronism with the reference clock generated by the clock generating circuit.

According to still another aspect of the present invention, there is provided a beam splitting device comprising:

a light source for generating first and second light beams having different wavelengths; and an optical element having a stepped edge for splitting the first and second light beams generated by the light source, the optical element causing a difference between an optical path of light passing through one side of the edge and an optical path of light passing through the other side of the edge, and the difference being almost ½ one of the wavelengths of the first and second light beams and being an almost integer multiple of the other of the wavelengths.

According to still another aspect of the present invention, there is provided an optomagnetic recording/reproducing apparatus comprising:

a plurality of light sources;

a diffraction grating for splitting each of light beams emitted from the light sources into 0th- and 1st-order diffracted light components;

an optical system for converging the 0th- and 1st-order diffracted light components of the plurality of light beams diffracted by the diffraction grating to form a main light spot and a sublight spot on each of a plurality of tracks of an optomagnetic recording medium;

magnetic field applying means for applying an A.C. magnetic field having a predetermined frequency on a medium portion irradiated with the main light spot; and driving means for pulse-driving the plurality of light sources with the signal modulated in accordance with an information signal, wherein information is recorded on each track with each main light spot and at the same time the information recorded on each track is reproduced with each sublight spot.

According to still another aspect of the present invention, there is provided an optomagnetic recording/reproducing apparatus comprising:

a first optical head for generating a first light beam of circular polarization;

a second optical head for generating a second light beam of linear polarization;

an optical system for converging the first and second light beams to form first and second light spots on one of a plurality of tracks parallelly formed on an optomagnetic recording medium; and moving means for moving the optical system across tracks, wherein information is recorded on a track with the first light spot and at the same time the information recorded on the track is reproduced with the second light spot.

BRIEF DESCRIPTION OF THE DRAWINGS

FIGS. 1A to 1F are charts showing an information recording operation by a conventional overwrite method using an A.C. magnetic field and light pulses;

FIGS. 7A to 7D are charts showing signal waveforms of the respective parts in the semiconductor laser drive circuit shown in FIG. 6;

FIGS. 11A to 11D are charts showing signal waveforms of the respective parts in the semiconductor laser drive circuit shown in FIG. 9;

FIGS. 14A to 14E are timing charts showing an operation of the semiconductor laser device of the embodiment shown in FIG. 12;

FIGS. 21A to 21I are charts showing an information recording operation of the embodiment shown in FIG. 17;

DETAILED DESCRIPTION OF THE PREFERRED EMBODIMENTS

Figure 2:
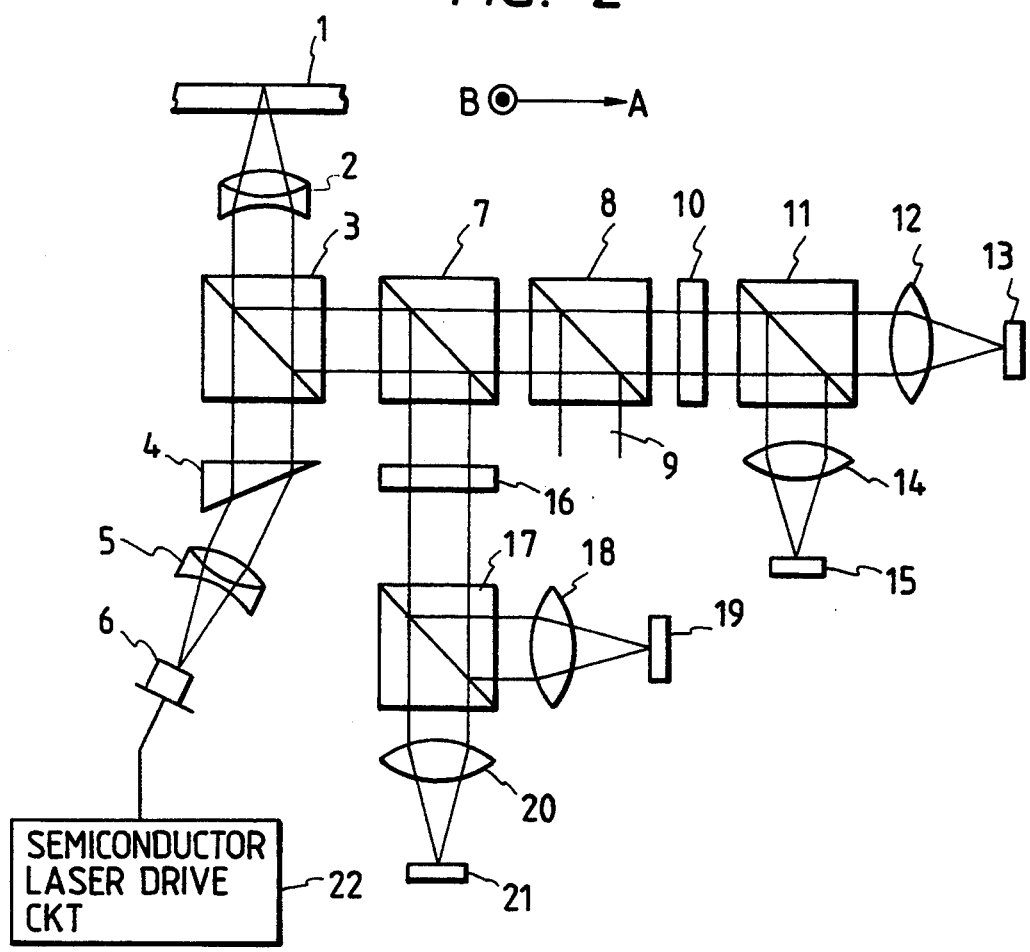
FIG. 2 is a view showing an arrangement of the first embodiment of an optical information recording/reproducing apparatus according to the present invention.

Preferred embodiments of the present invention will be described in detail with reference to the accompanying drawings. FIG. 2 is a view showing the first embodiment of an optical information recording/reproducing apparatus according to the present invention. Referring to FIG. 2, an optomagnetic disk 1 serves as an information recording medium. The optical information recording/reproducing apparatus includes an objective lens 2, a polarizing beam splitter 3, a beam shaping prism 4, a collimator lens 5, a semiconductor laser 6, and a semiconductor laser drive circuit 22. The objective lens 2 is used to converge a light beam radiated on the disk 1 to form a minute light spot. The polarizing beam splitter 3 splits a beam incident on the optomagnetic disk 1 and a beam reflected by the optomagnetic disk 1. The semiconductor laser 6 is provided as a recording-/reproduction light source. The detailed structure and characteristics of the semiconductor laser 6 will be described in detail later. The semiconductor laser drive circuit 22 drives the semiconductor laser 6. More specifically, the semiconductor laser drive circuit 22 drives the semiconductor laser 6 such that recording and reproduction light outputs having different wavelengths are oscillated in accordance with a recording signal. The reproduction light output is used as a verifying light beam and is defined as a constant light output which is not possible to effect the recording of information with wavelength $\lambda_1$ (830 nm). The recording light output is a light output having a high intensity and modulated with an information signal having a wavelength $\lambda_2$ (780 nm). The detailed structure and operation of the semiconductor laser drive circuit 22 will be described in detail later.

A dichroic prism 7 has a film having wavelength selectivity. The dichroic prism 7 transmits the $\lambda_1$ wavelength light serving as the verifying light beam toward a polarizing beam splitter 8 and reflects the $\lambda_2$ wavelength light serving as the recording light beam toward a $\lambda/2$ plate 16. The optical information recording/reproducing apparatus also includes a $\lambda/2$ plate 10, a polarizing beam splitter 11, condenser lenses 12 and 14, and light-receiving elements 13 and 15. The light-receiving elements 13 and 15 constitute a general differential detection optical system when a recording medium consists of an optomagnetic material. In this differential detection optical system, reflected light of the verifying light beam as the $\lambda_1$ wavelength light is differentially detected to reproduce a verifying signal. This optical system is also used for information reproduction in a normal reproduction mode, as a matter of course. Note that only the condenser lens 12 and the light-receiving element 13 are required when the recording medium is a phase change medium. A light beam 9 reflected by the polarizing beam splitter 8 is guided to a control optical system (not shown) and is used to obtain servo error signals for autofocusing control and autotracking control. In addition, a $\lambda/2$ plate 16, a polarizing beam splitter 17, condenser lenses 18 and 20, and light-receiving elements 19 and 21 constitute an optical system for differentially detecting the $\lambda_2$ wavelength light. If the wavelength $\lambda_2$ is shorter than the wavelength $\lambda_1$, the size of a light spot having the wavelength $\lambda_2$ on the optomagnetic disk 1 is smaller than that having the wavelength $\lambda_1$ thereon. In this case, the reproduction ability of the $\lambda_2$ wavelength light is higher than that of the $\lambda_1$ wavelength light. Therefore the above optical system is used in the case of enhancing the reproduction ability and therefore need not always be arranged.

Figure 3:
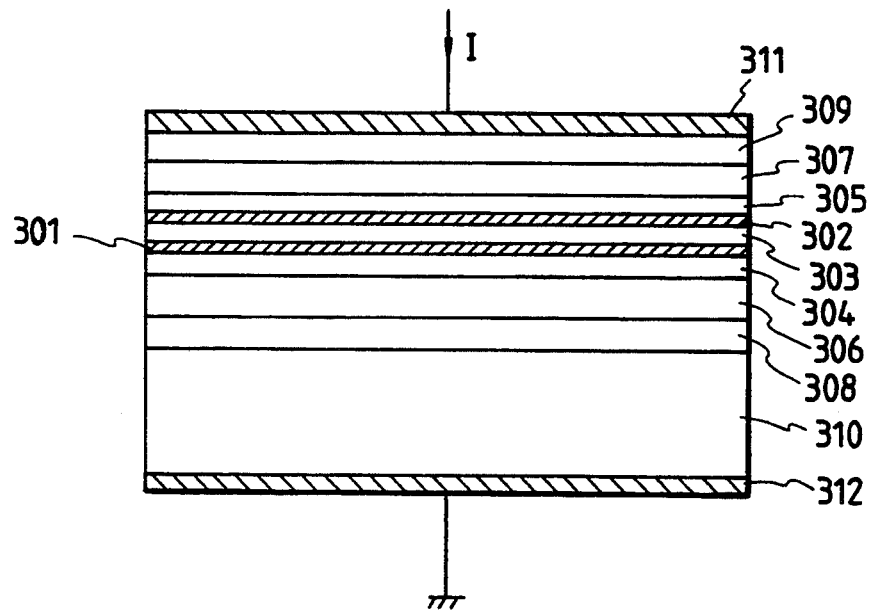
FIG. 3 is a sectional view showing a structure of a semiconductor laser used in the embodiment shown in FIG. 2.
Figure 4:
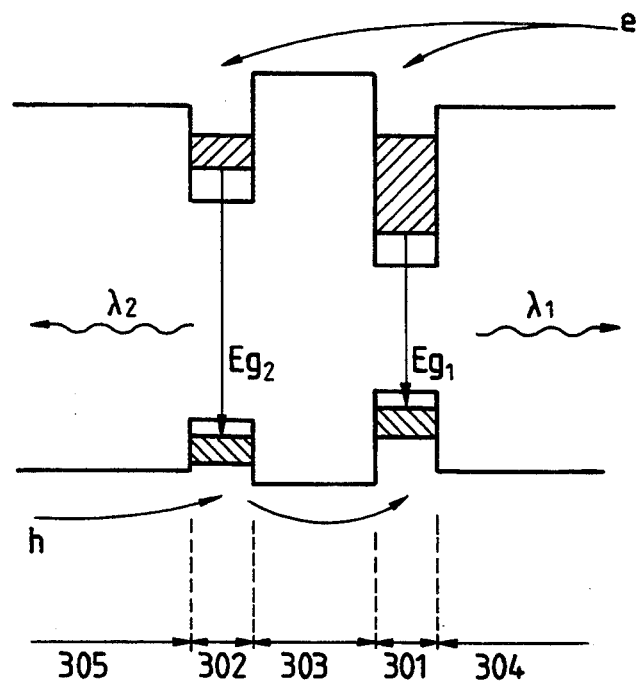
FIG. 4 is an energy band diagram near an active layer of the semiconductor laser shown in FIG. 3.

The detailed structure of the semiconductor laser 6 will be described below. As a semiconductor laser of this embodiment, a semiconductor laser having an active layer consisting of two quantum well layers having different compositions or widths can be used. FIG. 3 is a sectional view of the semiconductor laser 6, and FIG. 4 is an energy band diagram near the active layer of the semiconductor laser. As shown in FIGS. 3 and 4, in the structure of this semiconductor laser, a 80 Å thick GaAs well layer (second light-emitting layer) 301 is spaced apart from a 60 Å thick $Al_{0.12}Ga_{0.88}As$ well layer (first light-emitting layer) 302 through a 300 Å thick $Al_{0.3\text{-}6}Ga_{0.64}As$ barrier layer 303. The resultant structure is sandwiched between 500 Å thick GRIN $Al_{0.3}Ga_{0.7}As$ and $Al_{0.5}Ga_{0.5}As$ light-carrier confining layers (SCH layers) 304 and 305. The multilayered structure of the laser is obtained, as shown in FIG. 3, such that a 0.5-μm thick n+-GaAs buffer layer 308, a 1.5-μm thick n-$Al_{0.5}Ga_{0.5}As$ lower cladding layer 306, the SCH layer 304, the well layer 302, the barrier layer 303, the well layer 302, the SCH layer 305, a 1.5-μm thick p-$Al_{0.5}Ga_{0.5}As$ upper cladding layer 307, and a 0.5-μm thick p+-GaAs capping layer 309 are stacked on an n+-GaAs substrate 310 by molecular beam epitaxy. An Au/Cr electrode 311 is deposited on the p-side, and an Au-Ge/Au electrode 312 is deposited on the n-side, ohmic contact is established, and the electrodes are alloyed. Note that all the layers 304, 301, 303, 302, and 305 in the vicinity of the active layer are undoped layers.

Figure 5:
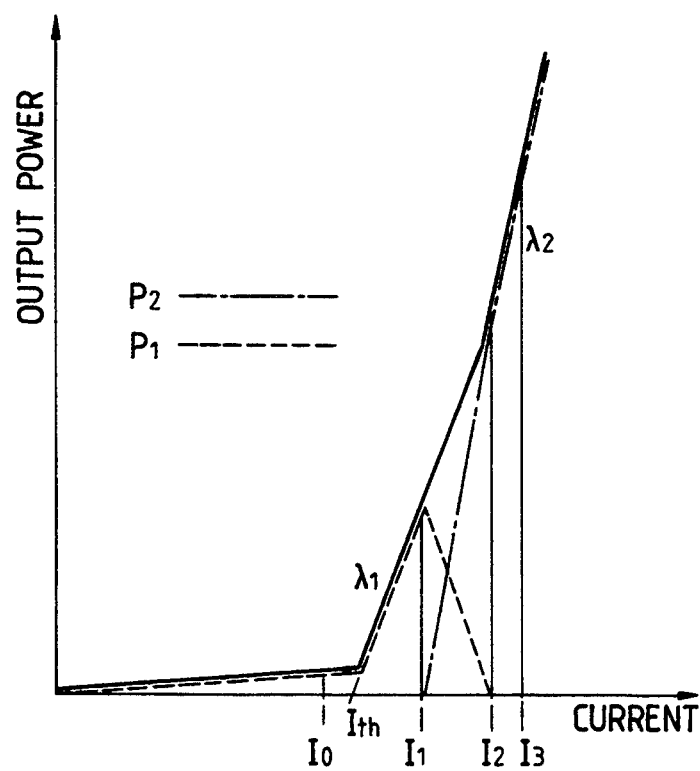
FIG. 5 is a graph showing current vs. light output characteristics of the semiconductor laser shown in FIG. 3.

When a current is supplied across the electrodes 312 and 311, electrons e are injected in the first light-emitting layer 302 and the second light-emitting layer 301. First, the electrons e are recombined with positive holes h in the first light-emitting layer 302 to induce and emit light having the wavelength $\lambda_1$ (830 nm). When the injection current is gradually increased, recombination between the electrons e and the positive holes h also occurs in the second light-emitting layer 301 to induce and emit light having the wavelength $\lambda_2$ (780 nm). When the injection current is further increased, oscillation of the wavelength $\lambda_1$ is stopped, and only light having the wavelength $\lambda_2$ is kept emitted. The above current vs. light output characteristics are schematically shown in FIG. 5. A current I is plotted along the abscissa. Light outputs $P_1$ and $P_2$ have the wavelengths $\lambda_1$ and $\lambda_2$, respectively. When the current I is increased, light having the wavelength $\lambda_1$ is oscillated at a first threshold current $I=I_{th}$. Oscillation of light having the wavelength $\lambda_2$ is started at a second threshold current $I=I_1$. When the current is further increased, oscillation of the light having the wavelength $\lambda_1$ is stopped at $I=I_2$, and only the light having the wavelength $\lambda_2$ is kept oscillated.

Figure 6:
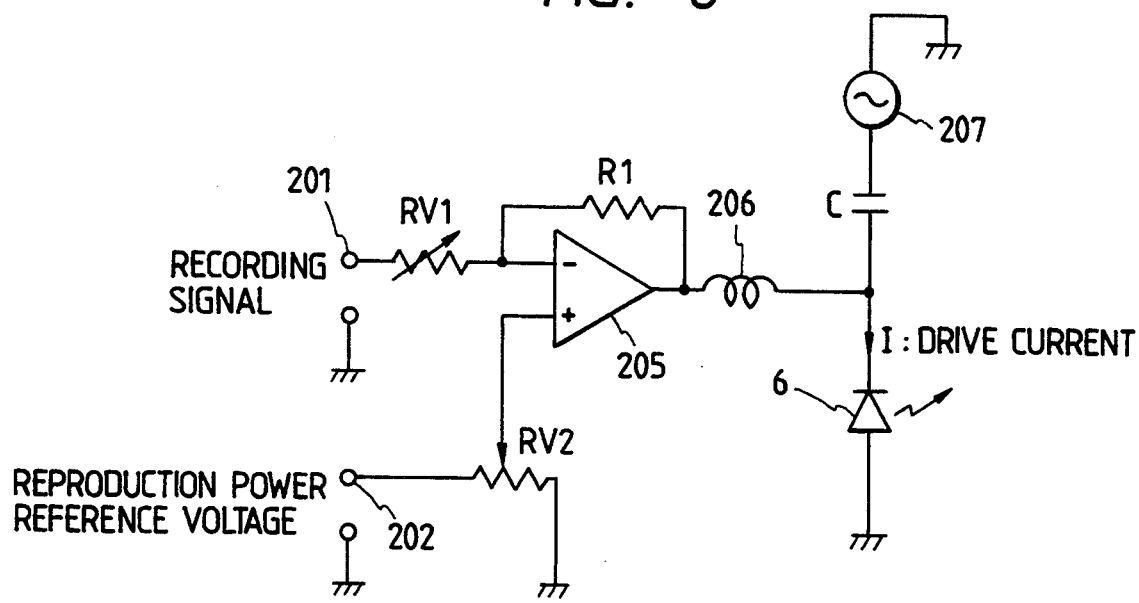
FIG. 6 is a circuit diagram showing a detailed arrangement of a semiconductor laser drive circuit used in the present invention.

FIG. 6 is a circuit diagram showing a detailed arrangement of the semiconductor laser drive circuit of the present invention. Note that this arrangement exemplifies a drive circuit for driving a semiconductor laser with a high-frequency signal so as to reduce noise of light reflected by the recording medium. Referring to FIG. 6, the semiconductor laser drive circuit includes an arithmetic amplifier 205, a choke coil 206, and a high-frequency oscillator 207. A recording signal to be recorded on the optomagnetic disk 1 is input to an input terminal 201. A reproduction power setting signal is input from a control unit (not shown) to an input terminal 202. The semiconductor laser 6 receives a high-frequency (e.g., several 100 MHz) sinusoidal signal ($I_3-I_1$ or $I_1-I_0$ in FIG. 5) having a predetermined amplitude or a rectangular drive signal from the oscillator 207. The choke coil 206 is arranged to prevent this drive current from leaking into the arithmetic amplifier 205. The semiconductor laser drive circuit also includes a resistor R1, semi-fixed resistors RV1 and RV2, and a capacitor C. In this drive circuit, when the recording signal is set at "0", the reproduction state is set. In this case, only the $\lambda_1$ wavelength light must be emitted with a predetermined output power, and the $\lambda_2$ wavelength light output must be set zero. For this purpose, in the reproduction state, a reproduction power reference voltage is input to the input terminal 202, so that the semiconductor laser 6 oscillates the reproduction power light output consisting of the $\lambda_1$ wavelength light. In this case, the semi-fixed resistor RV2 is adjusted so that high-frequency driving is performed between the drive currents $I_0$ and $I_1$ shown in FIG. 5. In this adjustment, a maximum drive current may be found so as to prevent the $\lambda_2$ wavelength light from returning to the light-receiving element 19 or 21 shown in FIG. 2. On the other hand, when the recording signal is set at "1", the semi-fixed resistor RV1 is adjusted to perform high-frequency driving between the drive currents $I_1$ and $I_3$ in FIG. 5.

FIGS. 7A to 7D show signal waveforms at the respective parts of the semiconductor laser drive circuit. FIG. 7A shows the recording signal, and FIG. 7B shows the drive current for the semiconductor laser 6. When the recording signal is set at "0", the reproduction power reference voltage is input to the input terminal 201, so that a nigh-frequency pulse current falling between $I_0$ and $I_1$ is supplied to the semiconductor laser 6, as shown in FIG. 7C. At this time, the light output from the semiconductor laser 6 is a predetermined power output having the wavelength $\lambda_1$, as shown in FIG. 7C. The light output having the wavelength $\lambda_2$ becomes zero, as shown in FIG. 7D. The light output having the wavelength $\lambda_1$ is used as the verifying light beam to be used immediately after recording. On the other hand, when the recording signal is set at "1", a high-frequency drive current falling between $I_1$ and $I_3$ is supplied to the semiconductor laser 6, as shown in FIG. 7B. In this case, the $\lambda_2$ light output has a high light intensity, as shown in FIG. 7D. This high-intensity light output is used for information recording, as a matter of course. At this time, the $\lambda_2$ light output is zero for the current $I_1$ and has a large peak value for the current $I_3$. Note that when the recording signal is set at "1", the $\lambda_1$ light output maintains the reproduction power, as shown in FIG. 7C and becomes a light output always having a predetermined reproduction power. In this embodiment, the light output from the semiconductor laser 6 is exemplified as a high-frequency light pulse train. Since this pulse train has a sufficiently high frequency as compared with the response speed of the light-receiving elements 13 and 15, the pulse train can be regarded as a substantially constant output.

Figure 8:
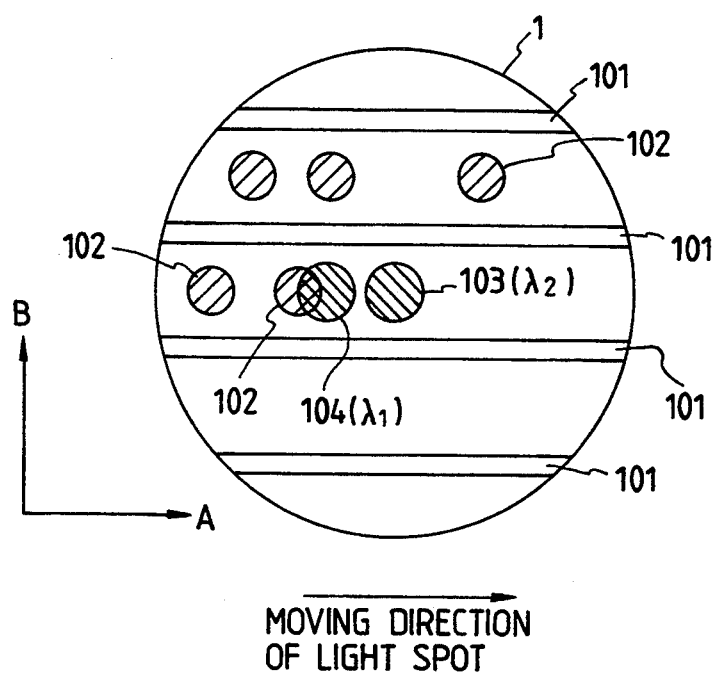
FIG. 8 is a view for explaining a state in which recording and reproduction light spots having different wavelengths are radiated on the recording surface of a recording medium in the apparatus shown in FIG. 2.

The operation of the optical information recording-/reproducing apparatus of the embodiment shown in FIG. 2 will be described below. When information is to be recorded, a recording signal is input to the semiconductor laser drive circuit 22, and the drive circuit 22 supplies a drive current (FIG. 7B) corresponding to the recording signal to the semiconductor laser 6. The semiconductor laser 6 outputs the $\lambda_1$ wavelength light and the $\lambda_2$ wavelength light shown in FIGS. 7C and 7D. The light outputs from the semiconductor laser 6 are collimated by the collimator lens 5 achromatic for the wavelengths $\lambda_1$ and $\lambda_2$. The sectional shape of each light output is modified to a circular shape by the beam shaping prism 4. At this time, since the $\lambda_1$ wavelength light has a wavelength different from the $\lambda_2$ wavelength light, these light beams have different refractive angles (or diffraction angles) at the prism 4 in accordance with the wavelength dispersion characteristics of the beam shaping prism 4. Therefore, the optical path of the $\lambda_1$ wavelength light cannot be parallel to that of the $\lambda_2$ wavelength light, so that a predetermined angle $\theta$ is formed therebetween. The light beams emerging from the beam shaping prism 4 pass through the polarizing beam splitter 3 and are incident on the objective lens 2 achromatic for the wavelengths $\lambda_1$ and $\lambda_2$, so that these light beams are focused into minute spots. These spots are formed on the recording surface of the optical disk 1. The light spots on the recording surface are shown in FIG. 8. A light spot 103 is obtained by the light beam having the wavelength $\lambda_2$, and a light spot 104 is obtained by the light beam having the wavelength $\lambda_1$. The distance between the light spots 103 and 104 is defined as ftan θ, where θ is the angle by the beam shaping prism 4 and f is the focal length of the objective lens 2. Therefore, the light spots 103 and 104 are formed on the recording track at a predetermined interval. The light spot 103 having the wavelength $\lambda_2$ is formed at a forward position, and the light spot 104 having the wavelength $\lambda_1$ follows the light spot 103. These light spots 103 and 104 are subjected to tracking control and focusing control. The light spots 103 and 104 scans the information track in an in-focus state. The recording medium has tracking control guide grooves 101.

Since the light spot 103 is a high-intensity light output having the wavelength $\lambda_2$, each recording pit 102 is formed in the recording surface, and the recorded pit 102 is scanned with the light spot 104 having the wavelength $\lambda_1$. At this time, information is recorded in accordance with an optical modulation method using radiation of the light spot 103 and application of a magnetic field of a predetermined direction from a magnetic head (not shown). In this case, since the light spot 104 is set to have the reproduction power, no information is recorded. Light beams of the light spots 103 and 104 which are reflected by the recording surface are incident on the dichroic prism 7 through the objective lens 2 and the polarizing beam splitter 3. In the dichroic prism 7, only the $\lambda_1$ wavelength light is transmitted toward the polarizing beam splitter 8 in accordance with the wavelength selection characteristics of the dichroic prism 7. Note that the $\lambda_2$ wavelength light is guided toward the $\lambda/2$ plate 16. The incident light is split into two beams in the polarizing beam splitter 8. One beam is guided to the $\lambda/2$ plate 10, and the other beam is guided as a light beam 9 toward a control optical system (not shown). The light beam guided to the $\lambda/2$ plate 10 is further split into two beams by the polarizing beam splitter 11. The split beams are detected by the light-receiving elements 13 and 15 through the condenser lenses 12 and 14, respectively. Signals detected by the light-receiving elements 13 and 15 are differentially detected by a differential amplifier (not shown), thereby reproducing an optomagnetic signal. In this manner, the light spot 104 of the $\lambda_1$ wavelength light is reproduced, and the information of the pit formed with the preceding light spot 103 is reproduced. The resultant reproduction signal is supplied to a verifying determination circuit (not shown) to compare the reproduction signal with the recording signal, thereby verifying and determining whether information is correctly recorded. That is, direct verifying for verifying recording immediately after recording is performed. As described above, the light spots 103 and 104 at the predetermined interval are used to scan the information track, and a series of information recording operations are performed such that reproduction is performed with the light spot 104 following the preceding light spot 103. If a verifying error is detected in the series of recording operations, recording is performed again at the same position, or recording is performed again at another substituent position. Note that the light beam 9 reflected by the polarizing beam splitter 8 is guided to the control optical system to generate a servo error signal for tracking control and focusing control. Tracking control and focusing control of light spots are performed by a servo control circuit (not shown).

In a normal information reproduction mode, the semiconductor laser drive circuit 22 drives the semiconductor laser 6 with a pulse drive current falling between $I_0$ and $I_1$. Therefore, the semiconductor laser 6 emits light having a reproduction power having the wavelength $\lambda_1$ shown in FIG. 7C. Only the light spot 104 of the $\lambda_1$ wavelength light shown in FIG. 7C is formed on the recording surface of the optical disk 1. In the normal reproduction mode, the information track is scanned with the light spot 104, and reproduction is performed using its reflected light in the reproduction optical system, thereby reproducing a series of pieces of information recorded in the information tracks.

Figure 9:
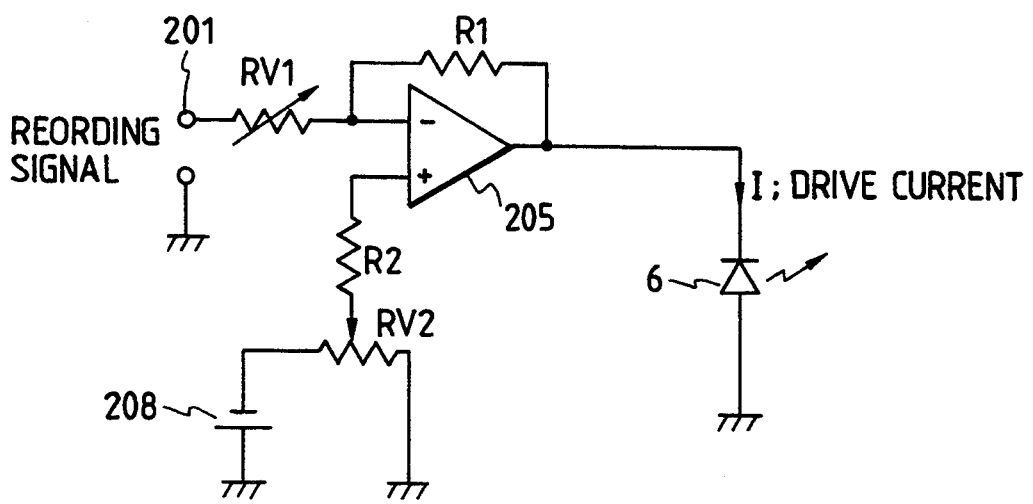
FIG. 9 is a circuit diagram showing another embodiment of a semiconductor laser driver circuit according to the present invention.
Figure 10:
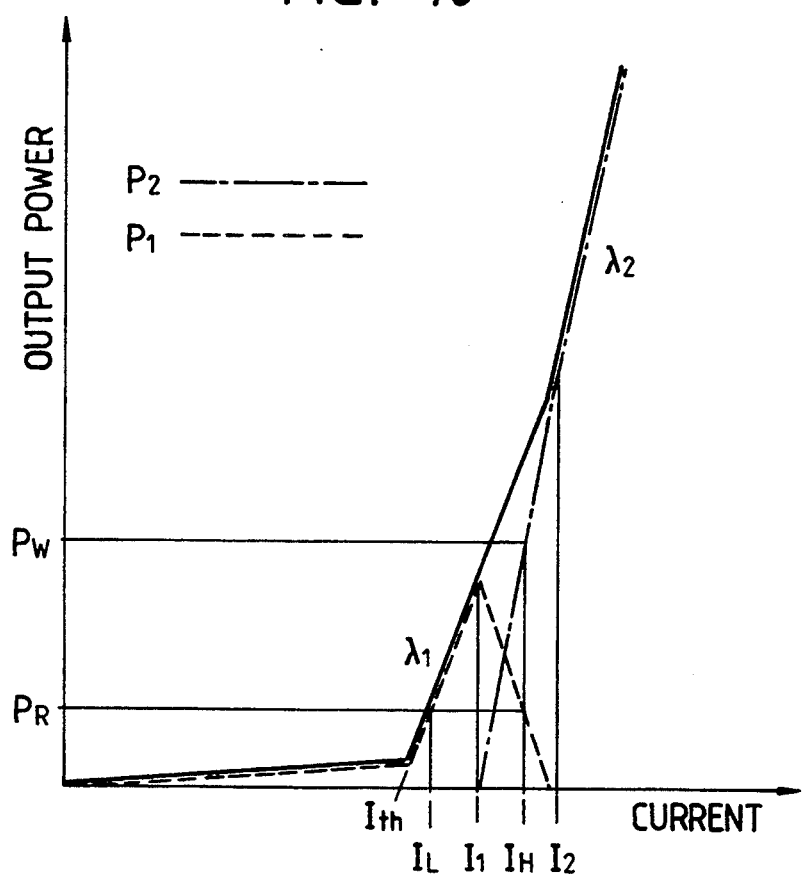
FIG. 10 is a graph showing semiconductor laser drive currents $I_L$ and $I_H$ in the semiconductor laser drive circuit shown in FIG. 9.

FIG. 9 is a circuit diagram showing another embodiment of a semiconductor laser drive circuit of the present invention. In the above embodiment, the semiconductor laser 6 is driven with a high-frequency pulsed drive current. In this embodiment, a semiconductor laser 6 is driven in a DC manner, thereby obtaining a reproduction power light output having a wavelength $\lambda_1$ and a recording power light output having a wavelength $\lambda_2$, as in the above embodiment. Referring to FIG. 9, a recording signal is input to an input terminal 201 and amplified by an arithmetic amplifier 205. The amplified signal is supplied to the semiconductor laser 6. When the recording signal is set at "0", the drive current for the semiconductor laser 6 is a current corresponding to an input voltage to the noninverting input terminal of the arithmetic amplifier 205. At this time, the drive current is initialized to $I_L$ (FIG. 10) so that a voltage at a DC power supply 208 is adjusted by a semi-fixed resistor RV2. The current $I_L$ shown in FIG. 10 is a drive current for driving the semiconductor laser 6 with a reproduction power. At this time, the semiconductor laser 6 oscillates a light output having a predetermined reproduction power $P_R$ having the wavelength $\lambda_1$ and does not oscillate light having the wavelength $\lambda_2$. On the other hand, when the recording signal is set at "1", the drive current for the semiconductor laser 6 becomes a current corresponding to a sum of an input voltage to the noninverting input terminal and an input voltage to the inverting input terminal of the operational amplifier 205. In this case, a semi-fixed resistor RV1 is adjusted so that the drive current is set at $I_H$ shown in FIG. 10. Therefore, at this time, light having the wavelength $\lambda_1$ is oscillated with the reproduction power $R_R$, and the light having the wavelength $\lambda_2$ is oscillated with a recording power $P_W$.

FIGS. 11A to 11D are charts showing signal waveforms at the respective parts in the above semiconductor laser drive circuit. FIG. 11A shows the recording signal, and FIG. 11B shows the drive current for the semiconductor laser 6. As described above, when the recording signal is set at "0", the drive current is $I_L$. When the recording signal is set at "1", the drive current becomes $I_H$. In this manner, the drive current changes between $I_L$ and $I_H$. For this reason, the light having the wavelength $\lambda_1$ is always oscillated with the reproduction power $P_R$ regardless of the recording signal, as shown in FIG. 11C. Only when the recording signal is set at "1", the light having the wavelength $\lambda_2$ is oscillated with the recording power $P_W$, as shown in FIG. 11D. Even in the drive circuit of this embodiment, the $\lambda_2$ wavelength light can be formed as a light spot 103, and a light spot 104 of the $\lambda_1$ wavelength light can be subsequently formed, as shown in FIG. 8. Therefore, direct verifying using one semiconductor laser can be performed as in the above embodiment.

Figure 12:
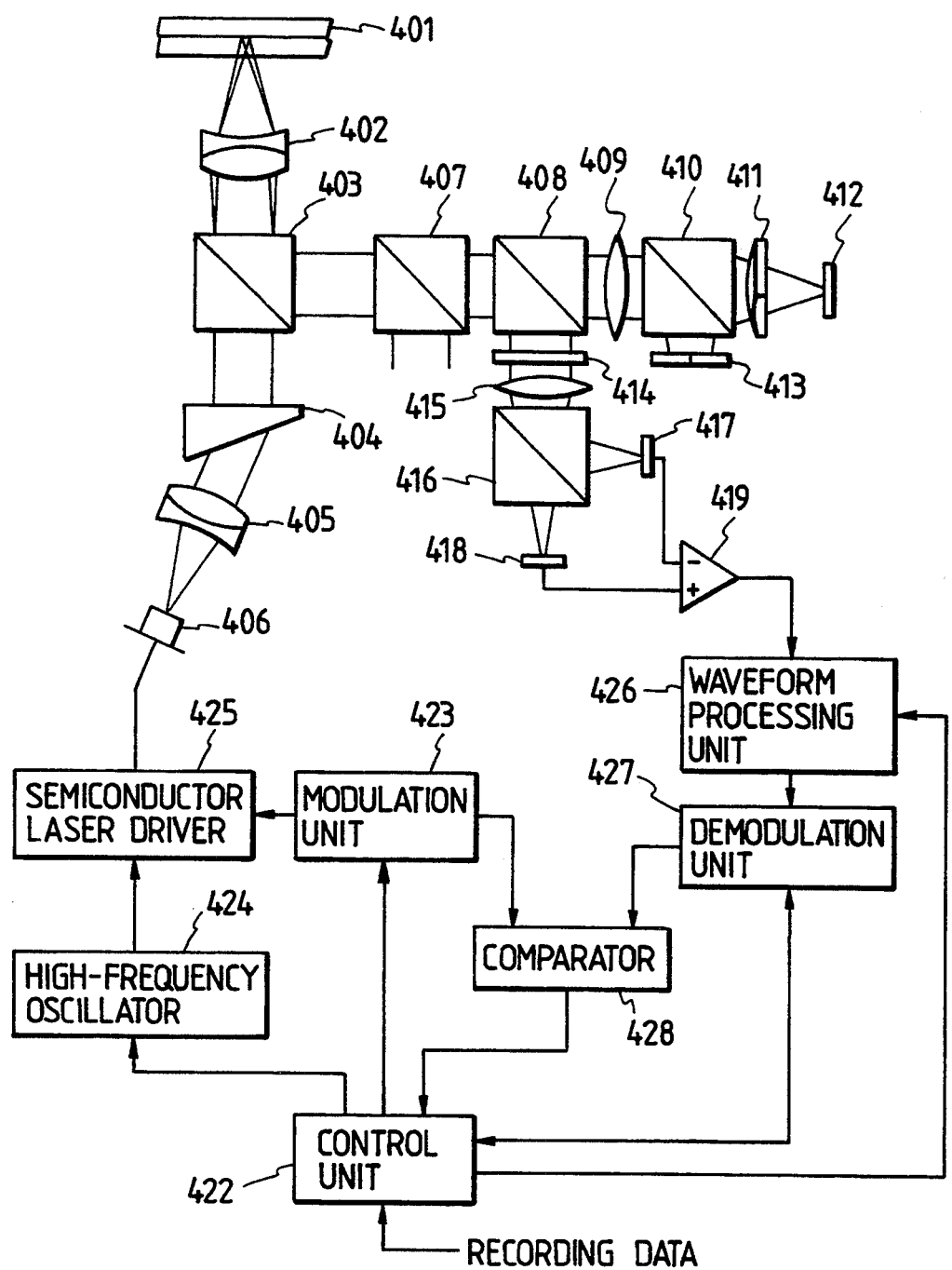
FIG. 12 is a view showing an arrangement of the second embodiment of an optical information recording/reproducing apparatus according to the present invention.

FIG. 12 is a view showing the second embodiment of an optical information recording/reproducing apparatus according to the present invention. Referring to FIG. 12, an optomagnetic disk 401 serves an information recording medium. The optical information recording/reproducing apparatus includes an achromatic pickup lens 402, a polarizing beam splitter 403, a prism 404, and an achromatic collimator lens 405. A two-wavelength semiconductor laser 406 simultaneously generate laser beams having two wavelengths $\lambda_1$ and $\lambda_2$. The laser beams emitted from this semiconductor laser 401 are collimated by the achromatic collimator lens 405 and are shaped by the prism 404. The beams are split into light beams having the wavelengths $\lambda_1$ and $\lambda_2$ in accordance with the wavelength splitting function by the wavelength dispersion characteristics of the prism 404. The two wavelength light beams from the two-wavelength semiconductor laser 401 are P-polarized light components having electric vector vibration planes within the drawing surface. After these beams are split by the prism 404, they pass through the polarizing beam splitter 403 and are formed as minute light spots on the recording layer of the optomagnetic disk 401 by means of the achromatic pickup lens 402. The transmittance of the polarizing beam splitter 403 is about 70%. The distance between the two light spots formed on the recording layer is defined as ftan $\theta$, where $\theta$ is the angle of beams emerging from the prism 404 and f is the focal length of the pickup lens 402. The light spots having the wavelengths $\lambda_1$ and $\lambda_2$ and emitted from the two-wavelength semiconductor laser 406 are incident on the same information track at different timings. The preceding light spot having the wavelength $\lambda_1$ is used as an information recording light spot, and the subsequent light spot having the wavelength $\lambda_2$ is used as a verifying light spot.

The light beams projected on the optomagnetic disk are reflected by the recording layer and are incident again on the polarizing beam splitter 403 through the pickup lens 402. The S-polarized light component containing in the reflected light is perfectly (100%) reflected by the polarizing beam splitter 403, and the P-polarized light component of the reflected light is partially (about 30%) reflected by the polarizing beam splitter 403. The S- and P-polarized light components are guided to the detection optical system. In the detection optical system, the light beam having the wavelength $\lambda_1$ is reflected in accordance with the wavelength selection function of a dichroic mirror 407, and the light beam having the wavelength $\lambda_2$ is transmitted through the dichroic mirror 407 and is guided to a beam splitter 408. The $\lambda_2$ wavelength light beam is further split into two light beams by the beam splitter 408. One split light beam is incident on a beam splitter 410 through a lens 409 and is further split into two beams, i.e., transmitted light and reflected light. The light beam passing through the beam splitter 410 is detected in a four-divided photodiode 412 through a cylindrical lens 411. Autofocusing control is performed by an astigmatism method using the detection signals obtained.

More specifically, a focusing error signal is detected on the basis of the detection signals of the four-divided photodiode 412. An actuator (not shown) for driving the pickup lens 402 in a focus direction on the basis of the focusing error signal is controlled by a focusing control circuit (not shown), thereby performing focusing control of the light beam. On the other hand, the light beam reflected by the beam splitter 410 is detected by a two-divided photodiode 413, and autotracking control is performed by a push-pull method using the detection signals obtained. More specifically, a tracking error signal is detected on the basis of the detection signals of the two-divided photodiode 413. An actuator (not shown) for driving the pickup lens 402 in the tracking direction on the basis of the tracking error signal is controlled by a tracking control circuit (not shown), thereby performing tracking control of the light beam.

On the other hand, the $\lambda_2$ wavelength light beam reflected by the beam splitter 408 is incident on a polarizing beam splitter 416 through a $\lambda/2$ plate 414 and a lens 415, so that the incident light beam is split into S- and P-polarized light components by the polarizing beam splitter 416 in accordance with the polarized components. The S- and P-polarized light components are detected by RF photodiodes 417 and 418, respectively, thereby obtaining two oppose-phase signal components having in-phase noise components generated by the semiconductor laser 406 and the optomagnetic disk 401. These two signals are differentially detected by a differential amplifier 419, thereby obtaining an RF signal which is superior in SN ratio and in which noise components are canceled.

The optical information recording/reproducing apparatus also includes a control unit 422, a modulation unit 423, a high-frequency oscillator 424, a semiconductor laser driver 425, a waveform processing unit 426, a demodulation unit 427, and a comparator 428. The control unit 422 includes a CPU and systematically controls the respective components. The modulation unit 423 modulates recording data sent from the control unit 422. The high-frequency oscillator 424 generates a high-frequency signal. The semiconductor laser driver 425 drives the semiconductor laser 406, modulates the pulse width of a high-frequency pulse from the high-frequency oscillator 424, and generates an injection current for the semiconductor laser 406 in accordance with the resultant PWM-modulated signal, thereby driving the semiconductor laser 406. Driving of the semiconductor laser 406 will be described in detail later. The waveform processing unit 426 performs processing such as integration and binarization of an RF signal obtained from the differential amplifier 419. The demodulation unit 427 performs ECC decoding and checking of the waveform-processed signal, thereby demodulating the original data. The comparator 428 compares the recording data with modulated reproduction data in information recording to verify whether information is correctly recorded.

In this embodiment, the semiconductor laser 406 has a structure identical to that shown in FIGS. 3 and 4. This semiconductor laser 406 is driven by a drive circuit as in FIG. 9 in accordance with the method shown in FIG. 10.

Figure 13A:
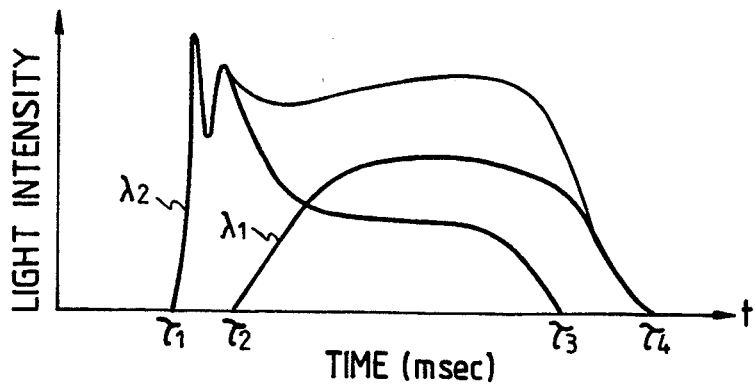
FIGS. 13A to 13D are a graph and charts for explaining dynamic switching characteristics of wavelengths of a two-wavelength semiconductor laser in the apparatus shown in FIG. 12.
Figure 13B:
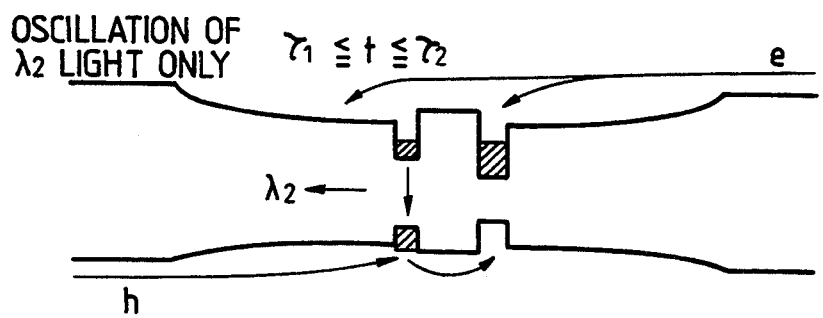

FIGS. 13A to 13D are a graph and charts for explaining the dynamic switching characteristics of the two-wavelength semiconductor laser 406. FIG. 13A is a graph showing the relationship between time and the light intensity. When a pulsed current is input to the semiconductor laser 406, electrons e and holes h are injected in an active layer from opposite directions. That is, the electrons e are injected from the n-side, and the holes h are injected from the p-side. At this time, the electrons e injected as indicated by the energy band in the vicinity of the active layer in FIG. 13B have a high mobility, so that two well layers 301 and 302 are abruptly set in a thermally equilibrium state. On the other hand, since the holes h have a low mobility, the holes are filled in the well layer 302, but injection in the well layer 301 is delayed by a time required for the holes h passing over a barrier layer 303. If the time t satisfies condition $t_1 \leq t \leq t_2$, recombination and emission occur only in the well layer 302. As shown in FIG. 13A, only the light having the wavelength $\lambda_2$ is oscillated. Note that a vibration appearing at the beginning of the light having the wavelength $\lambda_2$ is a relaxing vibration which also occurs in a normal semiconductor laser.

Figure 13C:
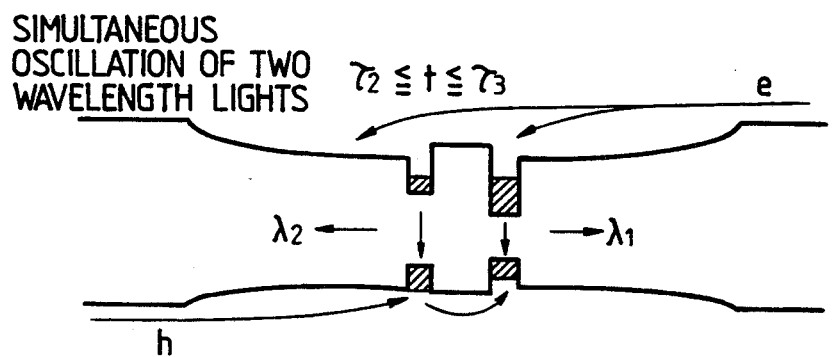
Figure 13D:
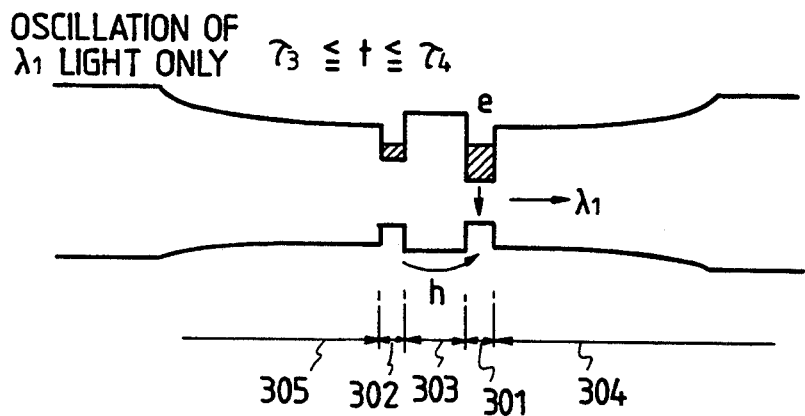

If the time t satisfies condition $t_2 \leq t \leq t_3$, the holes h are also filled in the well layer 301, as shown in FIG. 13C. In this case, the light having the wavelength $\lambda_1$ and the light having the wavelength $\lambda_2$ are oscillated from both the well layers 301 and 302, as shown in FIG. 13A. If condition $t_3 \leq t \leq t_4$ is satisfied, the density of the holes h in the well layers 301 and 302, the emission recombination speed, and the mobility of the holes h between both the well layers are balanced, as shown in FIG. 13D. In this case, oscillation of the wavelength $\lambda_2$ is stopped, and only the light having the wavelength $\lambda_1$ is oscillated, as shown in FIG. 13A.

When the pulsed current is injected in the semiconductor laser, as described above, the light having the wavelength $\lambda_2$ is oscillated in the first half of the light pulse, and the light having the wavelength $\lambda_1$ is oscillated in the second half of the light pulse. In this case, if the injection current level is appropriately selected, the emission time of the wavelength $\lambda_1$ is kept constant regardless of the current pulse width, and only the emission time of the wavelength $\lambda_1$ can be controlled by the current pulse width. Therefore, when the peak value of the current pulse injected into the semiconductor laser is kept constant and its pulse width is changed, only the optical energy of the light pulse of the wavelength $\lambda_1$ can be controlled while the optical energy of the light pulse having the wavelength $\lambda_2$ is kept constant, i.e., while the integration time of the light intensity is kept constant. In a heat mode optical memory such as an optomagnetic disk, since a mark is formed by converting optical energy into heat, a change in the light pulse width is caused to correspond to information, thereby recording information. In the embodiment shown in FIG. 12, the dynamic wavelength switching characteristics of the semiconductor laser 406 are utilized to modulate optical energy having the wavelength $\lambda_1$, thereby recording information. At the same time, the recorded information is reproduced and verified with the $\lambda_2$ wavelength light simultaneously generated with the $\lambda_1$ wavelength light.

The detailed operation of the optical information recording/reproducing apparatus shown in FIG. 12 will be described below. When information is to be recorded, recording data to be recorded is transferred to the control unit shown in FIG. 12. When a recording instruction is issued, the recording position of the optomagnetic disk 401 is designated. The control unit 422 controls a seek mechanism (not shown) in accordance with this designation to access a light spot on the designated information track. The control unit 422 confirms the physical and logical addresses on the optomagnetic disk 401 and whether recording is enabled or disabled. The control unit 422 sends the recording data to the modulation unit 423. The modulation unit 423 modulates the recording data in accordance with a predetermined modulation method. In addition, a header and an ECC code are added to the modulated recording data in the modulation unit 423. The modulation unit 423 then outputs the resultant data to the semiconductor laser driver 425. At the same time, the control unit 422 sends an operation instruction to the high-frequency oscillator 424 to generate a high-frequency signal. The semiconductor laser driver 425 therefore receives the modulated data from the modulation unit 423 and the high-frequency signal from the high-frequency oscillator 424, thereby driving the semiconductor laser 406 on the basis of these input signals.

The operation of the semiconductor laser device of this embodiment will be described with reference to FIGS. 14A to 14E. FIG. 14A shows the data modulated by the modulation unit 423, and FIG. 14B shows the high-frequency signal generated by the high-frequency oscillator 424. The semiconductor laser driver 425 modulates the pulse width of the high-frequency pulse signal in accordance with the modulated data. The pulse width of the injection current into the semiconductor laser 406 is set short when the modulated data is set at low level; the pulse width is set long when the modulated data is set at high level, as shown in FIG. 14C. The time axis in FIG. 14C is enlarged as compared with that in FIG. 14B. The semiconductor laser 406 is driven to emit light pulses (pulsed emission) corresponding to the drive pulses, as shown in FIGS. 14D and 14E. FIG. 14D shows an optical output having a wavelength $\lambda_2$. As described with reference to FIGS. 13A to 13D, the light output having the wavelength $\lambda_2$ has an almost constant light pulse waveform regardless of the pulse width of the injection current. On the other hand, FIG. 14C shows a light output having a wavelength $\lambda_1$, and its pulse width is influenced by pulse width modulation of the injection current. As indicated by broken lines in FIG. 14E, the average value of the light output at the modulation period of the recording data reflects information modulation. Note that the frequency of the high-frequency oscillator 424 is twice the maximum frequency in the information modulation range according to the sampling theorem. However, in order to assure precision, the frequency of the high-frequency oscillator 424 is preferably 10 or more times the maximum frequency in the information modulation range.

The semiconductor laser 406 simultaneously generates light having the wavelength $\lambda_1$ and light having the wavelength $\lambda_2$ different from the wavelength $\lambda_1$ upon driving of the laser driver 425. The light having the wavelength $\lambda_1$ is output as a light output modulated in accordance with information, and the light having the wavelength $\lambda_2$ is output as a constant light output. The two-wavelength beam and output from the semiconductor laser 406 is split into laser beams having the wavelengths $\lambda_1$ and $\lambda_2$ in accordance with the wavelength splitting function of the prism 404, and these two split laser beams are radiated as minute light spots on the information track of the optomagnetic disk 401 at a predetermined interval. More specifically, the $\lambda_1$ wavelength light spot PWM-modulated in accordance with the recording information is formed at a forward position of a given information track, and the $\lambda_2$ wavelength light spot having a predetermined intensity is formed at a backward position spaced apart from the forward position by a predetermined distance on the given information track. Light beams reflected by the optomagnetic disk 401 are detected by the four- and two-divided photodiodes 412 and 413, respectively. Autofocusing control and autotracking control are performed on the basis of detection signals from the four- and two-divided photodiodes 412 and 413. The two light spots follow and scan the information track of the rotating optomagnetic disk 401. In addition, a magnetic field having a predetermined direction is applied from a magnetic head (not shown) to the optomagnetic disk 401. A series of data are sequentially recorded on the information tracks upon radiation of the light spots intensity-modulated by pulse width modulation and application of the magnetic field. At this time, a light pulse having a narrow pulse width corresponding to low level of the data is radiated, as shown in FIG. 14C. However, since the average optical power is low, information will not be recorded.

The light reflected by the optomagnetic disk 401 is guided to the dichroic prism 407, and the $\lambda_1$ wavelength light is reflected and the $\lambda_2$ wavelength light is transmitted through the dichroic prism 407. Only the $\lambda_2$ wavelength light is guided to the reproduction optical system. The reflected light of the $\lambda_2$ light spot which scans the track following the $\lambda_1$ light spot for information recording is detected by the photodiodes 417 and 418 through the beam splitter 408 and the polarizing beam splitter 416. The detection signals from the photodiodes 417 and 418 are differentially detected by the differential amplifier 419, thereby reproducing an RF signal. The resultant reproduction signal is derived from the reflected light of the $\lambda_2$ light spot and serves as the reproduction signal of information recorded with the light spot having the wavelength $\lambda_1$. This reproduction signal is subjected to processing operations such as integration and binarization in the waveform processing unit 426 and is then demodulated by the demodulation unit 427, thereby obtaining the reproduction data. This reproduction data is supplied to the comparator 428 and is compared with the recording data from the control unit 422, thereby performing the verifying operation. The comparator 428 sends a verifying discrimination signal representing normal write access or necessity of a rewrite operation to the control unit 422. If a recording error occurs, the control unit 422 performs recording of the same data again at the same position or another position of the optomagnetic disk 401, thereby completing the processing.

In the normal information reproduction mode, a control signal is output from the control unit 422 to the modulation unit 423, and an output signal from the modulation unit 423 is kept at low level. The control unit 422 designates the high-frequency oscillator 424 to increase the frequency to cause the semiconductor laser driver 425 to narrow the pulse width of the injection current supplied to the semiconductor laser 406, thereby driving the semiconductor laser 406. The semiconductor laser 406 oscillates only light having the wavelength $\lambda_2$. As described above, in the information reproduction mode, only the light spot having the wavelength $\lambda_2$ is radiated on the information track of the optomagnetic disk 401. Light reflected by the information track is detected by the photodiodes 417 and 418 simultaneously with recording. The outputs from the photodiodes 417 and 418 are differentially detected by the differential amplifier 419, thereby reproducing the RF signal. In this case, the control unit 422 causes the demodulation unit 427 to directly supply the reproduction data to the control unit 422 without going through the comparator 428. Therefore, the reproduction data generated by the demodulation unit 427 is sent to the control unit 422 and is then externally transferred therefrom.

In this embodiment, the dynamic wavelength switching characteristics of the semiconductor laser are utilized to modulate the pulse width of the injection current in accordance with the information signal to be recorded. Two-wavelength light can be obtained as a light output having a high SN ratio with minimum crosstalk components. The resultant two-wavelength light is radiated as the light spot modulated in accordance with the recording information and the reproduction light spot having a predetermined light intensity such that these light spots are spaced apart from each other by a predetermined interval on the information track. A one-path direct verifying operation for recording information and simultaneously reading out the recorded information to confirm recording can be performed. For this reason, as compared with a conventional method in which one spot is used to switch between recording and verifying every rotation of the disk, the total throughput of the write speed can be greatly increased, thereby achieving a high transfer rate and high-speed access. In the direct verifying operation using two light spots, the crosstalk between the two light spots must be minimum. In order to satisfy this requirement according to a conventional technique, two semiconductor laser arrays are used to perform a direct verifying operation. According to this method, however, since a decrease in distance between the two light spots and crosstalk improvements have a trade-off relationship, it is very difficult to adjust the positions of the two semiconductor lasers. According to this embodiment, since the distance between the two light spots is defined as $f\tan\theta$ as described above, no optical adjustment is required, so that the manufacture thereof can be facilitated.

In the above embodiment, the dichroic prism is for splitting light having different wavelengths. Since the refocused spots are separated from each other by the wavelength difference, an identical function can be obtained by the size, shape, and position of a spatial filter and a photodiode in principle. However, the dichroic prism has an advantage over the above optical elements in positioning precision. A wavelength filter such as an etalon, a prism, or a diffraction grating may be used in place of the dichroic prism. In addition, although the prism 404 is used to perform beam shaping and wavelength separation, an identical function can be obtained even by a diffraction grating. In this case, the dispersion direction is opposite to that of the prism.

In this embodiment, light having two different wavelengths is used to perform information recording and the verifying operation. However, for example, a light spot may be formed in front of a recording light spot to detect a defect on the disk or confirm erasure of the previous data and may serve as a pilot spot for confirming the state prior to write access or a preheat spot for preheating the disk surface prior to write access. In addition, two light spots need not be formed on the same information track, but can be formed on different information tracks to perform simultaneous recording and reproduction.

Figure 15:
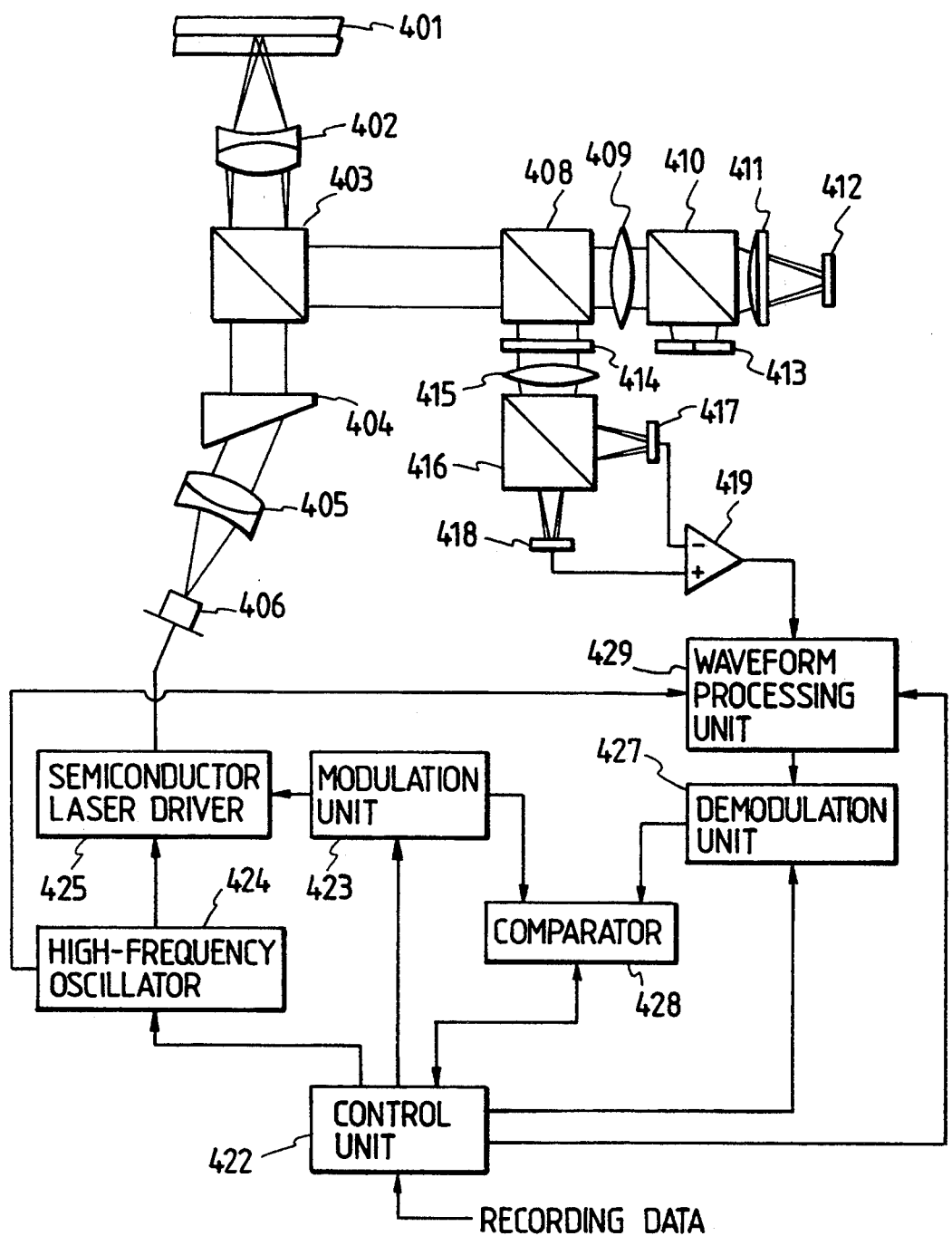
FIG. 15 is a view showing the third embodiment of an optical information recording/reproducing apparatus according to the present invention.

FIG. 15 is a view showing an arrangement of the third embodiment of an optical information recording-/reproducing apparatus according to the present invention. In the embodiment of FIG. 12, the light having two wavelengths is split using the dichroic mirror. However, in the embodiment of FIG. 15, the dynamic characteristics of a two-wavelength semiconductor laser in the high-frequency range are utilized to electrically separate the frequencies on the time axis. The same reference numerals as in FIG. 12 denote the same parts in FIG. 15. Referring to FIG. 15, when information is to be recorded, a two-wavelength semiconductor laser 406 is driven by a semiconductor laser driver 425 the same manner as in the embodiment of FIG. 12. A light spot having a wavelength $\lambda_1$ and a light spot having a wavelength $\lambda_2$ are formed on an information track of an optomagnetic disk 401, thereby recording the information on the information track. On the other hand, light reflected by the optomagnetic disk 401 is detected by photodiodes 417 and 418 through a beam splitter 408 and a polarizing beam splitter 416. In this case, since no dichroic prism is arranged, large spatial crosstalk components are generated in the photodiodes 417 and 418.

In this embodiment, a high-frequency signal from a high-frequency oscillator 424 is output to a waveform processing unit 429, and the waveform processing unit 429 samples and holds an RF signal from a differential amplifier 419 in synchronism with the high-frequency signal, thereby extracting data within the emission time of the $\lambda_2$ wavelength light. Therefore, synchronous detection is performed using the high-frequency signal in the signal processing step of the reproduction signal to extract only a reproduction signal derived from the $\lambda_2$ light beam, although the wavelength separation is not performed using the dichroic prism. The resultant reproduction signal is demodulated by a demodulation unit 427 and is compared with the recording data in a comparator 428, thereby performing a verifying operation. A method of extracting a sync pulse from an output signal from the high-frequency oscillator 424, adjusting the delay of the signal, and sampling and holding an analog signal of the RF signal is known as a synchronous detection method using the high-frequency pulse. Alternatively, synchronization data in which the frequency and phase of the high-frequency pulse are recovered may be generated by a PLL circuit from data obtained by binarizing the RF signal, and synchronous detection of only a signal derived from the $\lambda_2$ wavelength light may be performed using the above synchronization data. In this manner, in this embodiment, only the reproduction signal derived from the $\lambda_2$ wavelength light spot serving as the reproduction light spot can be extracted by electrical reproduction signal processing without using a wavelength separation element such as a dichroic prism. Therefore, the verifying operation performed simultaneously with information recording, i.e. a one-path direct verifying operation, can be performed in the same manner as in the embodiment of FIG. 12.

Figure 16:
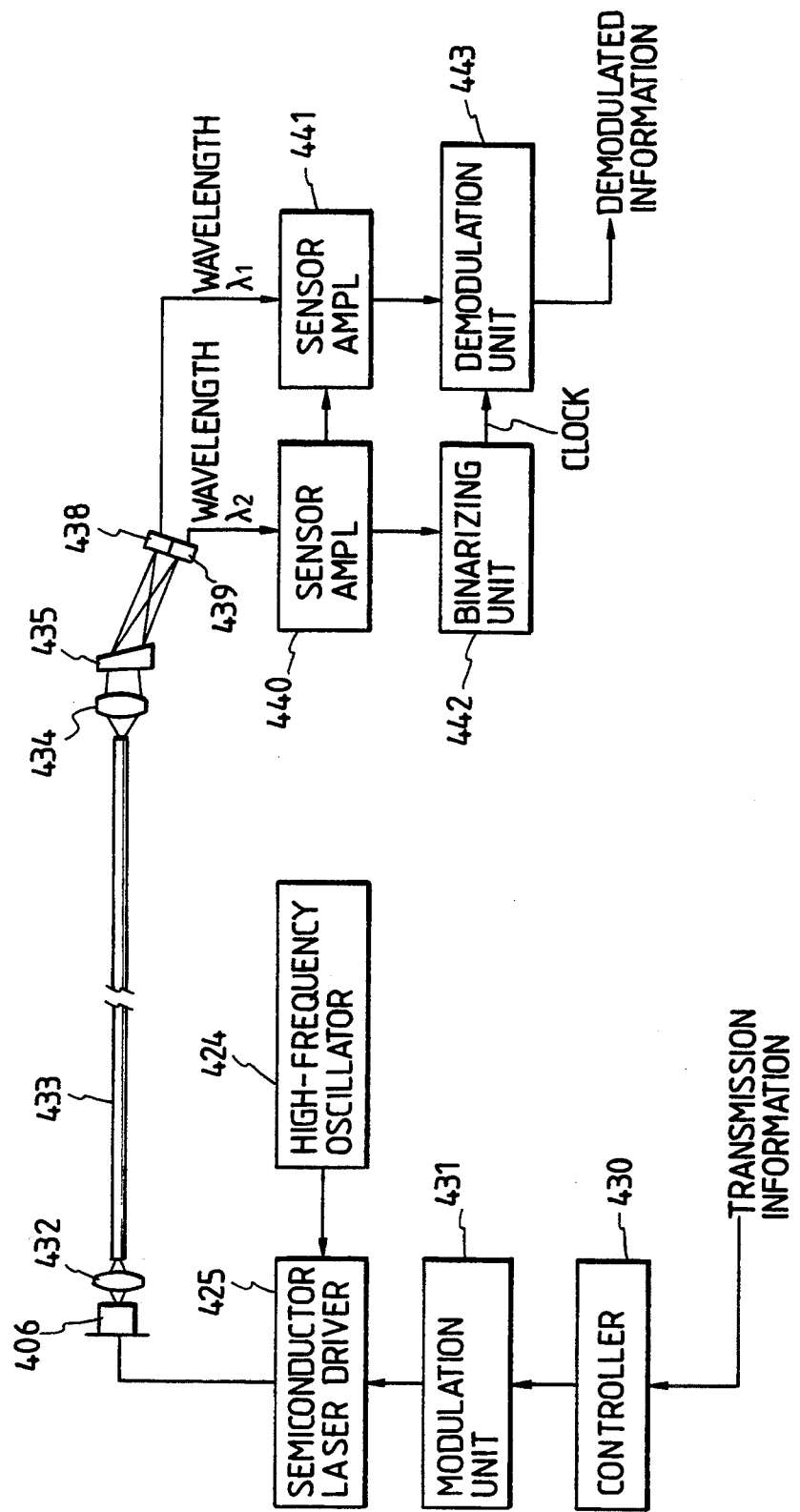
FIG. 16 is a view showing an arrangement of an embodiment of an optical communication apparatus according to the present invention.

FIG. 16 is a view showing an embodiment of an optical communication apparatus according to the present invention. The same reference numerals as in FIG. 12 denote the same parts in FIG. 16, and a detailed description thereof will be omitted. Referring to FIG. 16, the optical communication apparatus includes a coupling lens 432, an optical fiber 433 for transmitting optical information of a semiconductor laser 406, a lens 434, a prism 435, sensors 438 and 439, a controller 430, a modulation unit 431, sense amplifies 440 and 441, a binarizing unit 442, and a demodulation unit 443. The prism 435 spatially disperses light having wavelengths $\lambda_1$ and $\lambda_2$ guided through the optical fiber 433 in units of frequencies. The sensors 438 and 439 respectively detect the $\lambda_1$ wavelength light and the $\lambda_2$ wavelength light split by the prism 435. The sensor amplifiers (AMPL) 440 and 441 amplify signals detected by the sensors 438 and 439. The binarizing unit 442 binarizes a signal of the $\lambda_2$ wavelength light amplified by the sensor amplifier 440 to generate a clock signal. The demodulation unit 443 demodulates the original information on the basis of a signal of the wavelength $\lambda_1$ amplified by the sensor amplifier 441.

When information to be transmitted is input to the controller 430, the controller 430 transfers it to the modulation unit 431. The modulation unit 431 converts the transmission information into a communication protocol. The resultant converted data is sent to the semiconductor laser driver 425, and the semiconductor laser driver 425 drives the semiconductor laser 406 in the same manner as in the embodiment of FIG. 12. That is, a current obtained by modulating the pulse width of the high-frequency pulse from the high-frequency oscillator 424 in accordance with data is injected into the semiconductor laser 406, so that the semiconductor laser 406 outputs a light pulse having the wavelength $\lambda_2$ and a light pulse having the wavelength $\lambda_1$ and PWM-modulated in accordance with the data, as shown in FIGS. 14D and 14C. Each light pulse is incident on the optical fiber 433 through the coupling lens 432 and is guided to the reception side through the optical fiber 433. On the reception side, light transmitted through the optical fiber 435 is focused on the prism 435 by the lens 434. At this time, the $\lambda_1$ wavelength light and the $\lambda_2$ wavelength light are spatially split by the wavelength separation function of the prism 435. The $\lambda_1$ wavelength light is incident on the sensor 438, and the $\lambda_2$ wavelength light is incident on the sensor 439. These light beams are detected by the corresponding sensors. A detection signal of the $\lambda_1$ wavelength light detected by the sensor 438 is amplified by the sensor amplifier 441 and is demodulated to the original information by the demodulation unit 443. On the other hand, a detection signal of the $\lambda_2$ wavelength light detected by the sensor 439 is amplified by the sensor amplifier 440 and is converted into a clock signal having a predetermined frequency by the binarizing unit 442.

Each light pulse emitted from the semiconductor laser 406 propagates through the optical fiber 433 and is transmitted to the reception side. During the propagation, when the optical fiber 433 is bent or vibrated or when a disturbance such as a change in temperature occurs, the peak value of each light pulse may be changed. In this case, if the dispersion characteristics of the $\lambda_1$ wavelength light and the $\lambda_2$ wavelength light in the optical fiber 433 are as very small as negligible, the variation in the $\lambda_1$ wavelength light signal can be corrected on the basis of the $\lambda_2$ wavelength light signal. For example, since the variation in peak value of a light pulse can be detected as a variation in $\lambda_2$ wavelength light pulse train as originally uniform light, gain control utilizing an automatic gain control function of the sensor amplifier 441 is performed or a DC component is corrected on the basis of the above detection result, thereby correcting the variation in data.

The clock obtained in the binarizing unit 442 is sent to the demodulation unit 443. The demodulation unit 443 outputs demodulated data in synchronism with this clock signal. The clock signal from the binarizing unit 442 is a clock signal almost free from jitter components. Even if a Jitter component is superposed on the $\lambda_1$ wavelength light pulse transmitted, including information during transmission, through the optical fiber 433, data can be extracted in synchronism with the clock signal. Therefore, the transmitted data can be accurately demodulated regardless of the Jitter component. In this embodiment, although only one semiconductor laser is used, a light pulse containing information and a light pulse serving as a reference clock can be simultaneously transmitted. Therefore, in information demodulation, the data is synchronized with the reference clock to accurately demodulate the transmitted data regardless of the Jitter component generated during transmission through the optical fiber. In this embodiment, the light having the two wavelengths is split using the prism 435. However, the light having two wavelengths may be split by time decomposition with a small crosstalk component without using a wavelength separation element, in the same manner as in the embodiment of FIG. 12.

The above embodiments exemplify use of the semiconductor laser devices in the optical information recording/reproducing apparatuses and the optical communication apparatus. However, the semiconductor laser device of the present invention is similarly applicable to information transmission in, e.g., a photometric apparatus. In addition, in the above embodiments, information recording and communication using the light beams having two wavelengths are exemplified. However, light having three or more wavelengths may be used to realize high-performance recording/reproducing and communication apparatuses.

Figure 17:
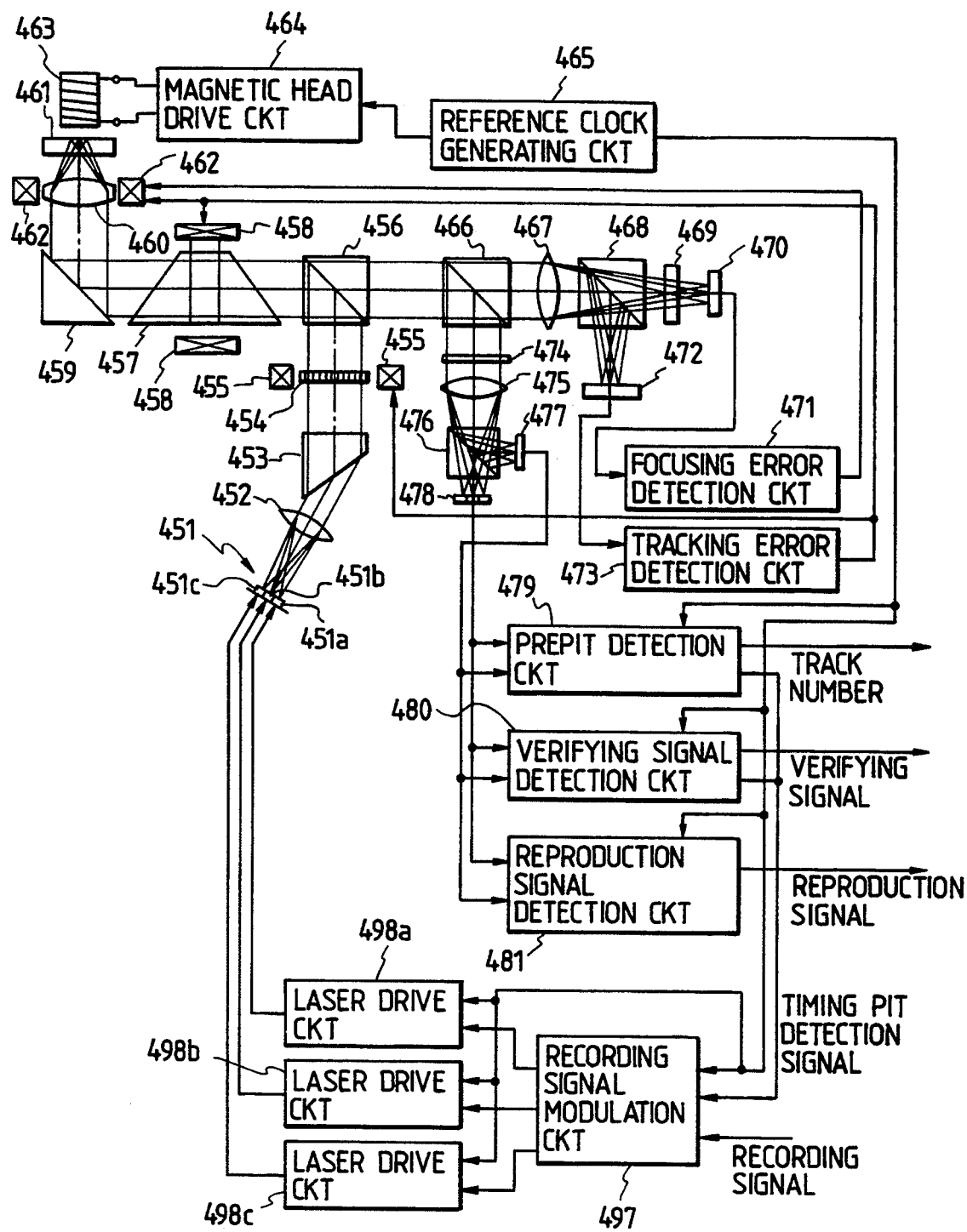
FIG. 17 is a view showing an arrangement of the first embodiment of an optomagnetic recording/reproducing apparatus according to the present invention.

An embodiment of an optomagnetic recording/reproducing apparatus according to the present invention will be described below. FIG. 17 is a view showing an arrangement of the first embodiment of the optomagnetic recording/reproducing apparatus. This embodiment exemplifies an optomagnetic recording/reproducing apparatus for recording/reproducing image information. Referring to FIG. 17, a laser source 451 is manufactured by arranging three semiconductor lasers 451a, 451b, and 451c in a hybrid or monolithic manner. Three laser beams emitted from the laser source 451 are collimated by a collimator lens 452 and are corrected by a beam shaping prism 453 such that the sectional shape of each collimated beam becomes a circular. The beams emerging from the beam shaping prism 453 pass through a diffraction grating 454 and are split into three sets of 0th- and ±1st-order diffracted light components. The intensity of the 0th-order diffracted light component is about 1/5 to ½ that of the ±1st-order diffracted light components. The diffraction directions of the ±1st-order diffracted light components are set to correspond to the directions almost parallel to the information tracks on an optomagnetic recording medium 461. The diffraction grating 454 is rotatable within a plane perpendicular to the optical axis. That is, rotation control of the diffraction grating 454 is performed by a drive unit 455 such as an actuator, so that the diffraction directions of the ±1st-order diffracted light components can be slightly rotated. The beams passing through the diffraction grating 454 are reflected by a polarizing beam splitter 456 and pass through an image rotating element 457. The image rotating element 457 is rotatable within the plane perpendicular to the optical axis and is controlled to be rotated by a drive unit 458 such as an actuator. By this rotation control, three sets of 0th- and ±1st-order light components as a whole are controlled to be slightly rotated.

The beams passing through the image rotating element 457 are reflected by a mirror 459, and the reflected beams are incident on an objective lens 460. The beams are focused by the objective lens 460 to form minute light spots on the optomagnetic recording medium 461. More specifically, three main light spots derived from the 0th-order diffracted light components and six sublight spots derived from the ±1st-order diffracted light components, i.e., a total of nine small light spots are formed on the magnetic layer of the optomagnetic recording medium 461. The objective lens 460 is arranged to be movable in a focusing direction as the direction of optical axis and a tracking direction perpendicular to the information tracks by means of a drive unit 462 such as an actuator. Focusing control and tracking control of the nine light spots as a whole are performed. A magnetic field modulation recording medium having a single magnetic layer or a two-layered structure obtained by utilizing an exchange coupling force can be used as the optomagnetic recording medium 461. The optomagnetic recording medium 461 is rotated at a constant speed by a spindle motor (not shown). A magnetic head 463 is arranged to oppose the objective lens 460 through the optomagnetic recording medium 461. The magnetic head 463 generates an A.C. magnetic field having a predetermined frequency in synchronism with a reference clock generated by a reference clock generating circuit driven by a magnetic head drive circuit 464, thereby applying this A.C. magnetic field to the optomagnetic recording medium 461.

Figure 18:
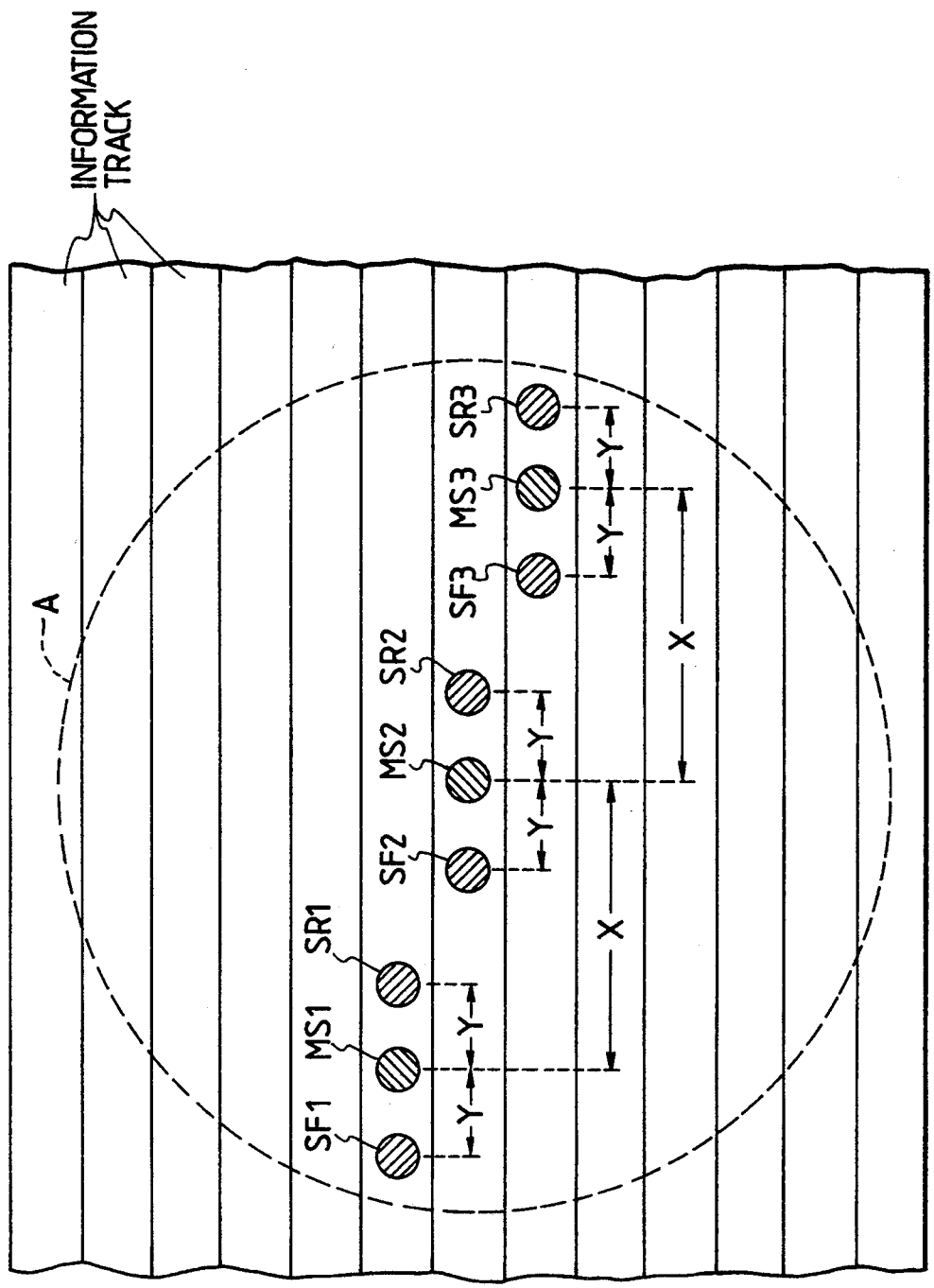
FIG. 18 is a view showing light spots radiated on a recording medium of the embodiment shown in FIG. 17.

FIG. 18 is a view showing the nine light spots formed on the optomagnetic recording medium 461 and the magnetic field generated by the magnetic head 463. Main light spots MS1, MS2, and MS3 are formed from the three 0th-order diffracted light components generated by the semiconductor lasers 451a, 451b, and 451c of the laser source 451. These main light spots are radiated on three adjacent information tracks. Sublight spots SF1 and SR1 are formed from the ±1st-order diffracted light components emitted from the semiconductor laser 451a and emerging from the diffraction grating 454. The sublight spots SF1 and SR1 are formed at two sides of the main light spot MS1 of the corresponding semiconductor laser 451a. Sublight spots SF2 and SR2 and sublight spots SF3 and SR3 are formed from the ±1st-order diffracted light components of the semiconductor lasers 451b and 451c and are formed at both sides of the main light spots MS2 and MS3, respectively. Note that the sublight spot SF1 and the sublight spot SR1 are located at forward and backward positions with respect to the main light spot MS1, and that the positional relationships between the remaining main light spots and the remaining sublight spots are the same as that described above. Each of the width of each information track and the diameter of each light spot is about 1 $\mu$m. A pitch X between the main light spots falls within the range of about several tens of $\mu$m to 100 $\mu$m, and a pitch Y between each main light spot and the corresponding sublight spot falls within the range of several $\mu$m to several tens of $\mu$m. These pitches are set not to cause thermal interference between the adjacent light spots. A circle A indicated by the broken line represents the range of the effective magnetic field strength. This range basically covers the three main light spots. In consideration of controllability of the magnetic head 463, the diameter of the range of the effective magnetic field strength is preferably several hundreds of $\mu$m.

Referring back to FIG. 17, a polarizing beam splitter 466 splits light reflected by the optomagnetic recording medium 461 into beams for a control optical system and a reproduction optical system. The laser beams emitted from the laser source 451 are reflected by the optomagnetic recording medium 461 and are guided to the polarizing beam splitter 456 again through the objective lens 460, the mirror 459, and the image rotating element 457.

Each beam is then transmitted through the polarizing beam splitter 456 and is incident on the polarizing beam splitter 466. The incident beam is transmitted or reflected by the polarizing beam splitter 466. The transmitted beam is guided to the control optical system, and the reflected beam is guided to the reproduction optical system. The transmitted beam is focused by a condenser lens 467 and is incident on a beam splitter 468. The incident beam is further transmitted or reflected by the beam splitter 468. The transmitted beam passes through a cylindrical lens 469 for providing an astigmatism and is detected by a photodetector 470. A detection signal from the photodetector 470 is supplied to a focusing error detection circuit 471 to detect a focusing error signal. The beam reflected by the beam splitter 468 is detected by a photodetector 472. A tracking error detection circuit 473 detects a tracking error signal on the basis of a detection signal from the photodetector 472.

On the other hand, the polarization direction of the beam guided by the polarizing beam splitter 466 toward the reproduction optical system is rotated by a λ/2 plate 474 through 45°. The rotated beam is incident on a polarizing beam splitter 476 through a condenser lens 475. The incident light is reflected or transmitted by the polarizing beam splitter 476. The reflected beam is detected by a photodetector 477, and the transmitted beam is detected by a photodetector 478. Detection signals from the photodetectors 477 and 478 are supplied to a prepit detection circuit 479, a verifying signal detection circuit 480, and a reproduction signal detection circuit 481. By these detection circuits, a signal representing a track number signal, a timing pit detection signal, a verifying signal, a reproduction signal, and the like are generated.

A recording signal modulation circuit 497 separates the recording signal into three components and modulates these three components. In this embodiment, as described above, the image information is recorded as the recording information. The image information is separated into three color components, i.e., R (red), G (green), and B (blue) components in units of pixels. Each component signal has 8-bit gradation. The recording signal is repeatedly sent in the time-serial form of R, G, and B signals in units of pixels. The recording signal modulation circuit 497 divides this recording signal into three groups. For example, the recording signal is divided into an a group, a b group, and a c group bit by bit. In this case, the information signal is divided into 8-bit R, G, and B components. R, G, and B are defined as the a, b, and c groups, respectively. The recording signal modulation circuit 497 modulates the respective groups into signals corresponding to the recording patterns on the optomagnetic recording medium 461. Modulated signals of the a, b, and c groups are respectively output to laser drive circuits 498a, 498b, and 498c. Each laser drive circuit drives the corresponding semiconductor laser with pulses representing the input modulated signal. Image information is recorded in the information track in cooperation with application of the A.C. magnetic field from the magnetic head 463. This recording operation will be described in detail later.

Figure 19:
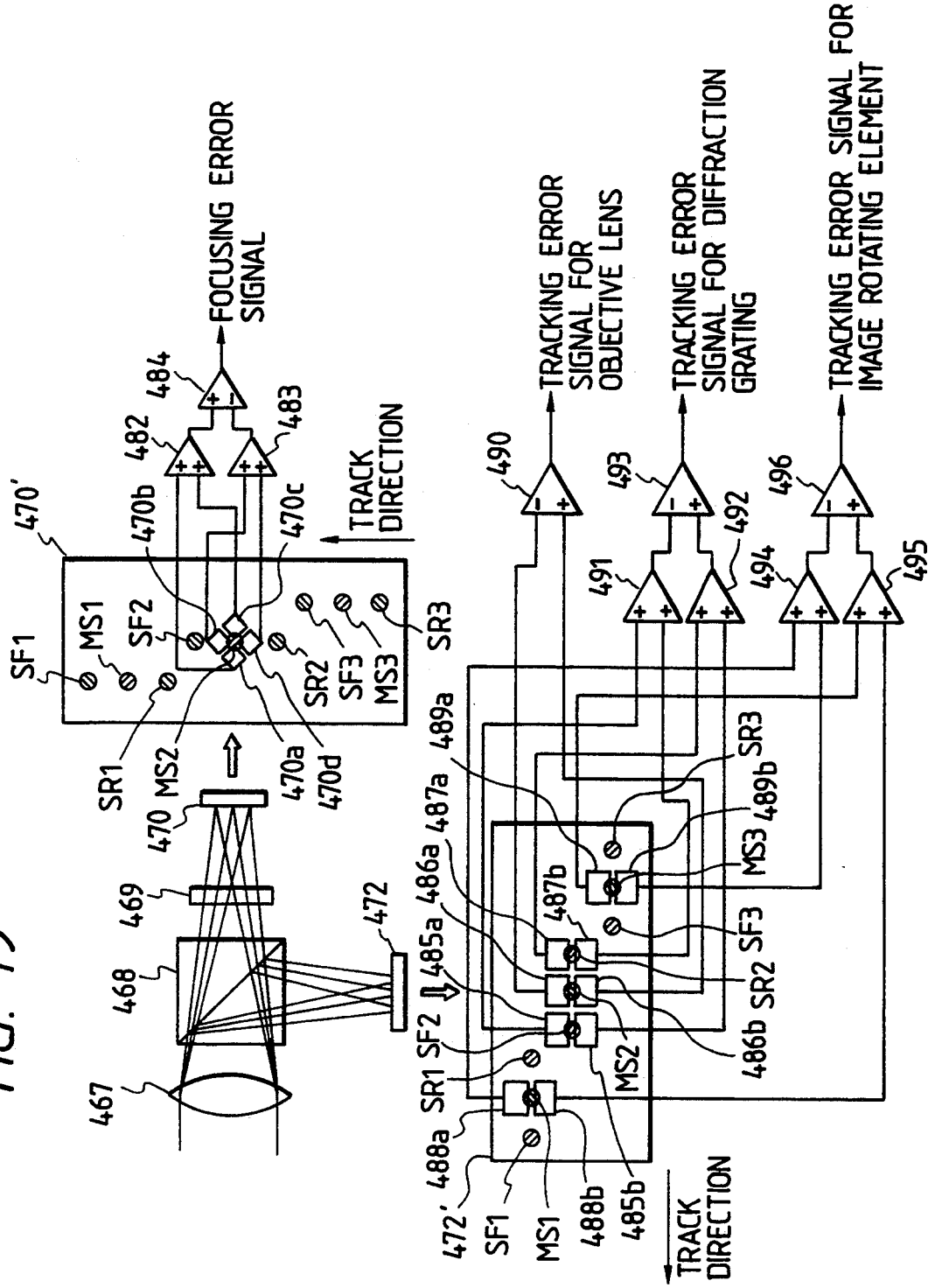
FIG. 19 is a view showing a photodetector in a control optical system, light spots projected on the photodetector, and focusing and tracking control circuits in detail in the embodiment of FIG. 17.

Operations for detecting servo error signals in the focusing error detection circuit 471 and the tracking error detection circuit 473 will be described with reference to FIG. 19. Referring to FIG. 19, a detection surface 470' of the photodetector 470 is enlarged. As is apparent from this enlarged view, the photodetector 470 is constituted by a four-divided photodetector in which the detection surface is spatially divided into four portions. The detection surface of the four-divided photodetector is divided in a crossed shape, and these division lines are inclined at 45° with respect to the information tracks of the optomagnetic recording medium 461. This four-divided photodetector detects only the central main light spot MS2 as the 0th-order diffracted light component of the semiconductor laser 451b, as shown in FIG. 17. In this case, detection pieces 470a to 470d of the four-divided photodetector are located at positions where the in-focus spot MS2 becomes a minimum circle of confusion. When the focus state is shifted to a near- or far-focus state, the light amount distribution of the spot MS2 is deformed from the circular distribution to an oval distribution extending in the horizontal or vertical direction (or in the vertical or horizontal direction).

Detection signals from the detection pieces 470a and 470c at oblique positions of all the detection pieces of the four-divided photodetector are added by an adder 482, and detection signals from the detection pieces 470b and 470d are added by an adder 483. Sum signals from the adders 482 and 483 are subtracted from each other by a subtracter 484, so that a focusing error signal by a so-called astigmatism method is produced. The resultant focusing error signal is sent to the drive unit 462 shown in FIG. 17, so that the objective lens 460 is driven in the focusing direction on the basis of this error signal, thereby performing focusing control of all the nine light spots.

A detection surface 472' of the photodetector 472 is enlarged in FIG. 19. The photodetector 472 is constituted by five two-divided photodetectors 485 to 489 each having a detection surface divided into two portions along the track direction. The three central two-divided photodetectors 485 to 487 are arranged in correspondence with the central light spot array (SF2, MS2, and SR2). The two-divided photodetectors 485 to 487 have detection pieces 485a and 485b, detection pieces 486a and 486b, and detection pieces 487a and 487b, respectively. When the two-divided photodetectors 485 to 487 are located so that the light amount distribution of the main light spot MS2 and the sublight spots SF2 and SR2 is located at the center when the light spots are located on the track. Detection signals from the detection pieces 486a and 486b of the two-divided photodetector 486 corresponding to the main light spot MS2 are subtracted from each other by a subtracter 490, thereby obtaining a tracking error signal by a so-called push-pull method. The resultant tracking error signal is sent to the drive unit 462, and the drive unit 462 drives the objective lens 460 in the tracking direction on the basis of this error signal, thereby performing tracking control of all the nine light spots. Detection signals from one pair of detection pieces 485a and 487b of the two-divided photodetectors 485 and 487 are added by an adder 491, and detection signals from the other pair of detection pieces 485b and 487a are added by an adder 492. The resultant sum signals are subtracted from each other by a subtracter 493, thereby generating a tracking error signal for tracking control of the diffraction grating 454. The resultant error signal is sent to the drive unit 455, and the drive unit 455 drives the diffraction grating 454 on the basis of this error signal. The diffraction grating 454 is slightly rotated through the optical axis, thereby performing auxiliary tracking control of the six sublight spots.

The two-divided photodetector 488 is arranged correspondence with the main light spot MS1 of the first array shown in FIG. 18. The two-divided photodetector 489 is arranged in correspondence with the main light spot MS3 of the third array. These two two-divided photodetectors are located such that the light spots are located at the center when the respective main light spots are located on the corresponding tracks. The two-divided photodetectors 488 and 489 have two detection pieces 488a and 488b and two detection pieces 489a and 489b, respectively. Detection signals from the detection piece 488a of the two-divided photodetector 488 and the detection piece 489b of the two-divided photodetector 489 are added to each other by an adder 494. Detection signals from the detection pieces 488b and 489a are added to each other by an adder 495. Sum signals from the adders 494 and 495 are subtracted from each other by a subtracter 496, thereby generating a tracking error signal for the image rotating element 457. The resultant error signal is sent to the drive unit 458, and the drive unit 458 drives the image rotating element 457 on the basis of this error signal. The image rotating element 457 is slightly rotated about the optical axis to perform auxiliary tracking control of the main light spots MS1 and MS3. In this embodiment, in focusing control, only the main light spot MS2 is detected. However, for example, the three main light spots may be detected, and an average value of the detection values may be used to perform focusing control.

Figure 20:
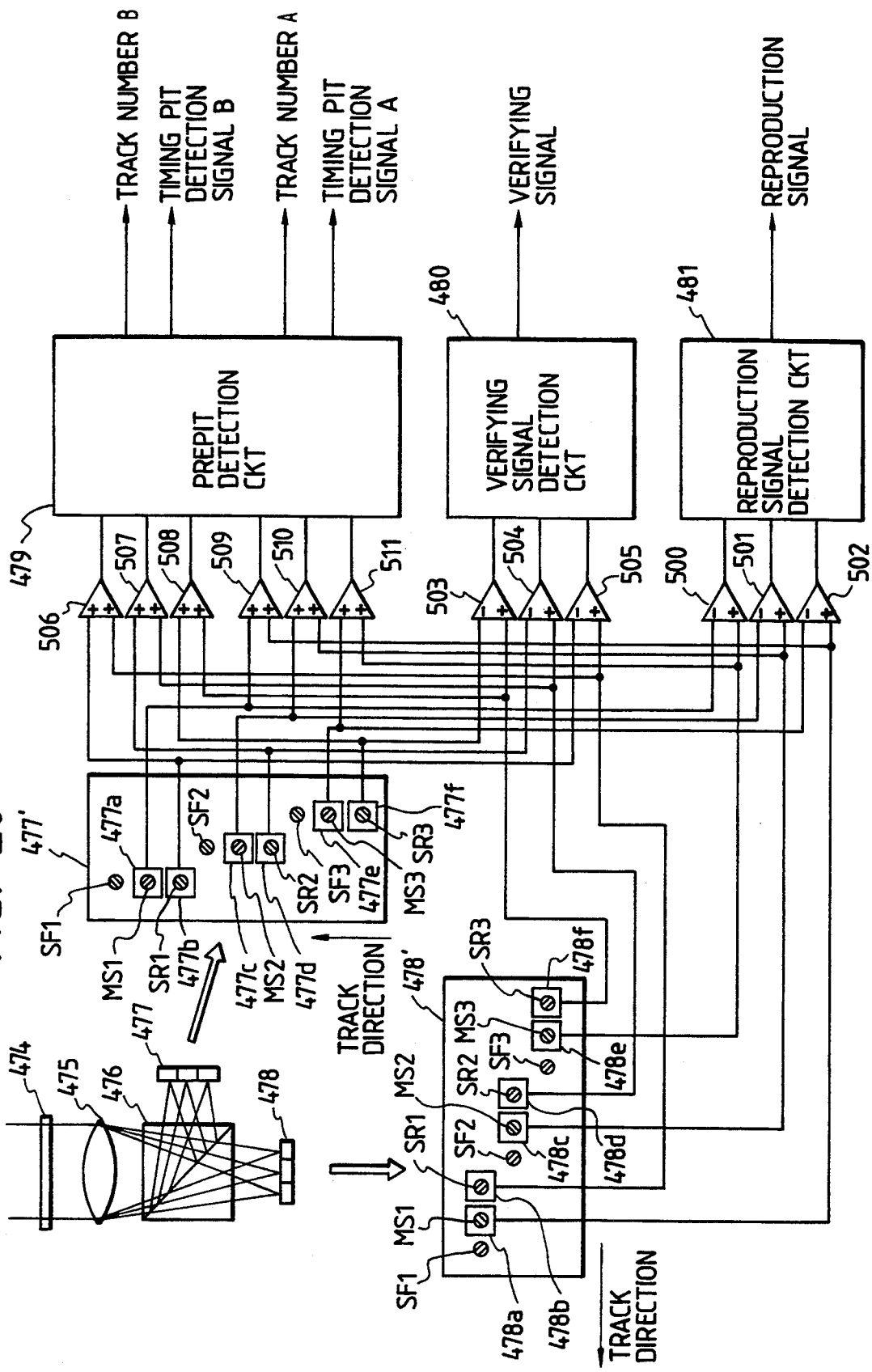
FIG. 20 is a view showing a photodetector in a reproduction optical system, light spots projected on the photodetector, and prepit detection, verifying signal detection, and reproduction signal detection circuits in the embodiment of FIG. 17.

Detection operations of the prepit detection circuit 479, the verifying signal detection circuit 480, and the reproduction signal detection circuit 481 shown in FIG. 17 will be described with reference to FIG. 20. Referring to FIG. 20, light spots are projected on a detection surface 477' of the photodetector 477, and light spots are projected on a detection surface 478' of the photodetector 478. The photodetector 477 has detection pieces 477a and 477b corresponding to the main light spot MS1 and the sublight spot SR1 of the first array, detection pieces 477c and 477d corresponding to the main light spot MS2 and the sublight spot SR2 of the central array, and detection pieces 477e and 477f corresponding to the main light spot MS3 and the sublight spot SR3 of the third array shown in FIG. 18. Similarly, the photodetector 478 has detection pieces 478a to 478f corresponding to the main light spots MS1 to MS3 and the sublight spots SR1 to SR3 of the first to third arrays.

Detection signals from the detection piece 477a of the photodetector 477 and the detection piece 478a of the photodetector 478 are subtracted from each other by a subtracter 502 to generate an optomagnetic signal by the main light spot MS1. Similarly, detection signals from the detection pieces 477c and 478c are subtracted from each other by a subtracter 501, and detection signals from the detection pieces 477e and 478e are subtracted from each other by a subtracter 500, thereby generating optomagnetic signals by the main light spots MS2 and MS3. The optomagnetic signals from the respective subtracters are supplied to the reproduction signal detection circuit 481 to demodulate the respective optomagnetic signals and at the same time synthesize the demodulated data, thereby generating a reproduction signal. The above reproduction processing is performed in the normal information reproduction mode. At this time, the laser power of each of the semiconductor lasers 451a to 451c is set to be a reproduction power.

On the other hand, in the information recording mode, although this operation will be described in detail later, pieces of information are formed in parallel on the three information tracks using the main light spots MS1 to MS3. In this information recording mode, detection signals from the detection pieces 477b and 478b, detection signals from the detection pieces 477d and 478d, and detection signals from the detection pieces 477f and 478f are respectively subtracted by subtracters 505, 504, and 503, thereby generating optomagnetic signals by the sublight spots SR1, SR2, and SR3. That is, the pieces of information recorded by the preceding main light spots MS1, MS2, and MS3 are reproduced in real time by the subsequent sublight spots SR1 to SR3 following the main light spots MS1, MS2, and MS3. The optomagnetic signals obtained from the subtracters 503 to 505 are demodulated and synthesized by the verifying signal detection circuit 480, thereby reproducing the verifying signal. The resultant verifying signal is supplied to a verifying determination circuit (not shown) and is compared with the recording signal, thereby performing a direct verifying operation performed simultaneously with information recording.

The detection signals from the detection pieces 477a and 478a, the detection signals from the detection pieces 477c and 478c, and the detection signals from the detection pieces 477e and 478e are added by adders 509, 510, and 511, respectively, thereby generating light amount change signals of the main light spots MS1, MS2, and MS3. The resultant light amount change signals are supplied to the prepit detection circuit 479 to detect prepit information recorded on each information track. A signal A representing a track number and a timing pit signal A are output from the prepit detection signal 479. These pieces of prepit information are utilized in the recording mode and the normal information reproduction mode. In addition, the detection signals from the detection pieces 477b and 478b, the detection signals from the detection pieces 477d and 478d, and the detection signals from the detection pieces 477f and 478f are respectively added by adders 506, 507, and 508, thereby generating light amount change signals of the sublight spots SR1, SR2, and SR3, respectively. The prepit detection circuit 479 detects prepit information on each information track on the basis of the corresponding light amount change signal, thereby outputting a signal B representing a track number and a timing pit detection signal B. The pieces of prepit information are utilized for forming the verifying signal.

A detailed operation of this embodiment will be described with reference to the timing charts in FIGS. 21A to 21I. A recording operation will be described first. FIG. 21A shows a reference clock generated by the reference clock generation circuit 465, and FIG. 21B shows an A.C. magnetic field generated by the magnetic head 463. The reference clock is output to the magnetic head drive circuit 464. This drive circuit 464 generates an A.C. magnetic field having a predetermined frequency synchronized with the reference clock. The A.C. magnetic field is applied to the optomagnetic recording medium 461. Note that the reference clock is also output to the prepit detection circuit 479, the verifying signal detection circuit 480, the reproduction signal detection circuit 481, the recording signal modulation circuit 497, and the like.

On the other hand, an optical head constituted by an optical element such as the objective lens 470 shown in FIG. 17 is accessed by a moving mechanism (not shown) so that nine light spots are located on the designated information tracks. In this case, the light spots are moved to the three target information tracks while a track number is detected by the prepit detection circuit 479. Since the nine light spots are used to simultaneously record and reproduce information, the same track number is assigned to each set of three information tracks, and the number of track numbers to be detected can be reduced, thereby simplifying the circuit arrangement by the reduction in the number of track numbers. Each track number is not always detected using the nine light spots. In coarse movement, the track number may be detected using only the central main light spot. When the central main light spot reaches one of the set of three information tracks, fine control may be performed such that the track numbers are detected using other main light spots and sublight spots to track the light spots to the target information tracks. By such control, the light spots can be moved onto the target information tracks at a higher speed. When all the nine light spots are located on the target information tracks, it is recognized by the timing pit detection signal A in the prepit detected by the prepit detection circuit 479 that the main light spots MS1, MS2, and MS3 reach the corresponding information tracks. FIG. 21C shows its timing pit detection signal. Timing pits may be recorded on all the information tracks, and the timing pits of the information tracks may be detected by the three main light spots. In this case, information recording is started in units of information tracks. Alteratively, only the timing pit of the central information track may be recorded, and this pit detection signal may be used to detect that the three light spots have reached the recording region. In this case, pieces of information are simultaneously recorded on the three information tracks.

Figure 22:
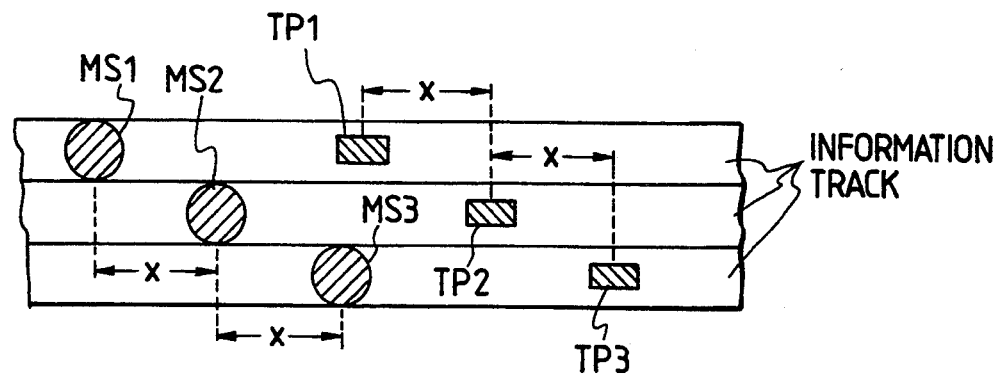
FIG. 22 is a view showing timing pits on a recording medium in the embodiment of FIG. 17.

FIG. 22 is a view showing the state in which timing pits are recorded on the information tracks, respectively. Timing pits TP1, TP2, and TP3 are recorded to be spaced apart from each other by the pitch X of the main light spots. Note that the sublight spots are not illustrated in FIG. 22. If the timing pits are recorded such that they are aligned in the radial direction of the optomagnetic recording medium 461, recording and reproduction timings are shifted in units of main light spots. In order to eliminate these shifts, the capacities of the buffer memories in the recording signal modulation circuit 497 and the reproduction signal detection circuit 481 are undesirably increased. As shown in FIG. 22, when the timing pits are shifted from each other in the same manner as in the main light spots MS1, MS2, and MS3, the recording and reproduction start timings of the three main light spots will not be shifted from each other.

Referring back to FIGS. 21A to 21I, the timing pit detection signal is shown in FIG. 21C. In this embodiment, the central main light spot representatively detects the corresponding timing pit. In prepit detection, a laser beam having a predetermined power which is equal to that of the reproduction beam is generated by the laser source 451. When the timing pit is detected, several initial pulses are erased to eliminate a turn-off error of each light spot. A start pit (domain) is recorded, and information is then recorded in accordance with the modulated signal. FIG. 21D shows a laser pulse from the semiconductor laser 451a driven by the laser drive circuit 498a. The semiconductor laser 451 focuses the light spot MS1 on the information track and is driven by modulation of the recording signal modulation circuit 497. FIG. 21E shows a laser pulse from the semiconductor laser 451b which corresponds to the light spot MS2.

FIG. 21F shows a laser pulse from the semiconductor laser 451c which corresponds to the light spot MS3. These laser pulses are driven in accordance with modulation in the recording signal circuit 497. The high level of the main light spot by the corresponding laser pulse is a high power which allows recording and erasure. The low level of the main light spot is the same power as the reproduction power.

Two initial pulses of each laser beam are erasure pulses and are applied at a position where the A.C. magnetic field has a negative peak. The magnetization direction of a portion irradiated with the laser pulse of the main light spot on each information track orients downward. If erasure omissions of the recording information occur, they are perfectly erased, hereby restoring the magnetization direction to the initial state. In this embodiment, the downward magnetization direction is the initial state. FIG. 21G shows a recording pattern on the information track which corresponds to the laser pulse of the main light spot MS1 from the semiconductor laser 451a. FIG. 21H shows a recording pattern corresponding to the main light spot MS2 from the semiconductor laser 451b. FIG. 21I shows a recording pattern corresponding to the main light spot MS3 from the semiconductor laser 451c. The sublight spots do not influence recording pattern formation. In each recording pattern, a region represented by a white region represents a domain in which the magnetization direction faces downward, and a region represented by a hatched region represents a domain in which the magnetization direction orients upward. A region irradiated with the two erasure laser pulses has a downward magnetization direction and is thus apparently initialized.

The third pulse of each laser signal is used to record a start pit representing the start position in information recording. Since the start pit is recorded with a modulation signal of "1" represented in each laser signal, the start pit laser pulse is radiated in synchronism with the positive peak position of the A.C. magnetic field. Therefore, upward domains are formed in the three information tracks, respectively. Upon detection of the timing pits, upward domains are recorded. After the start pit laser pulse is radiated, laser pulses shown in FIGS. 21D, 21E, and 21F are radiated on the respective information tracks. These laser pulses are obtained such that the image information is separated into R, G, and B components in units of pixels, and these components are modulated. The laser pulses are projected parallel to each other on the three information tracks. In the laser pulse shown in FIG. 21D, after the third start pit laser pulse is projected, two laser pulses are projected in synchronism with the positive peak point of the A.C. magnetic field before the next modulation signal of "1" is projected. When the modulation signal goes to "1" and four laser pulses are projected in synchronism with the negative peak point of the A.C. magnetic field before the next modulation signal goes to "1". That is, the laser pulse is synchronized with the positive or negative timing of the A.C. magnetic field in accordance with a domain to be recorded, and the magnetization direction is reversed when the modulation signal is set at "1". As shown in FIG. 21G, domains are sequentially recorded in accordance with the modulation signals such that an upward domain represented by the hatched portion is recorded first, and the downward and upward domains are then recorded. As shown in FIGS. 21E and 21F, domains are recorded by the laser pulses in substantially the same manner as described above. The domains are sequentially formed on the information tracks, as shown in FIGS. 21H and 21I.

When the sublight spots pass through the timing pits, modulation operations of the respective semiconductor lasers as shown in FIGS. 21D, 21E, and 21F are already started. The sublight spots are projected on the information tracks as the laser pulses of high and low levels. Note that the power of the sublight spot at high level is set to be equal to or lower than the power of the main light spot in the reproduction mode. When a light amount change signal and an optomagnetic signal are obtained using the modulated light pulses, changes in power of the light pulses adversely affect the signal precision. For example, if the gain of the photodetector is switched between the high and low levels of the modulation signal to obtain a detection output, the influences of the changes in power on the signals can be eliminated.

When the timing pit is detected by the prepit detection circuit 479, the verifying signal detection circuit 480 reads the start pit. As described with reference to FIG. 20, the domains recorded by the preceding main light spots on the information tracks are sequentially read. The optomagnetic signals obtained from the three information tracks are demodulated and synthesized to generate a verifying reproduction signal. This verifying signal is compared with the recording signal. If a difference between the verifying signal and the recording signal exceeds a reference value, a recording error is determined, and recording is performed again at the same or different position on the optomagnetic recording medium 461. In this embodiment, the verifying signal is compared with the recording signal. However, the optomagnetic signal from each information track may be compared with each modulation signal obtained from the recording signal modulation circuit.

The normal reproduction operation will be described below. The power of the main light spot from each semiconductor laser of the laser source 451 is set to have a reproduction power having a predetermined intensity in the reproduction mode. Three main light spots are moved to the three information tracks in the same manner as in the recording mode. At this time, the sublight spots are not used. When the respective light spots are moved to the target information tracks, the timing pit detection signals are detected. Thereafter, the start pit is detected by the reproduction signal detection circuit 481, thereby detecting the start of the domain train on the information track. The recorded information is reproduced, as described with reference to FIG. 20. That is, the optomagnetic signals generated in the respective subtracters 500 to 502 are sequentially received, demodulated, and synthesized by the reproduction signal detection circuit 481. The pieces of information separated into the R, G, and B components on the three information tracks in units of pixels are restored to the original image information. The restored image information is output as a reproduction signal.

In this embodiment, each of the light beams from the three semiconductor lasers is divided into 0th- and 1st-order diffracted light components by the diffraction grating. The diffracted light components are projected as the main light spot and two sublight spots on the three information tracks, thereby recording the pieces of information on the information tracks. The verifying signal is generated on the basis of reflected light of each sublight spot, and the information recorded on each information track can be immediately verified, thereby performing a direct verifying operation. The pieces of information recorded on a plurality of information tracks can be verified while they are recorded on the information tracks, thereby greatly shortening the recording time. The diffraction grating is slightly rotated about the optical axis on the basis of the tracking error signal derived from the reflected light of each sublight spot, so that tracking control of the sublight spots respectively radiated on the three information tracks can be corrected. In addition, the image rotation element is slightly rotated about the optical axis on the basis of the tracking error signal derived from the reflected light of each main light spot, thereby correcting the tracking control of the main light spots. Therefore, even if the main light spots and the sublight spots are radiated on a plurality of information tracks, the main light spots and the sublight spots can be accurately scanned following the information tracks, thereby stably recording and reproducing the information.

In the embodiment described above, R, G, and B data separated in units of pixels are recorded on the three information tracks using the three semiconductor lasers. However, the present invention is not limited to this. For example, any information except for image information can be recorded as the recording information. In this case, the number of information tracks subjected to simultaneous recording is not limited to three. The number of information tracks may be two or less, or four or more. This embodiment exemplifies an optomagnetic recording apparatus of a magnetic field modulated light pulse method for performing an overwrite operation on the optomagnetic recording medium. However, the present invention is not limited to this. The present invention is similarly applicable to any apparatus using an optical modulation method or an apparatus using a phase change medium if this apparatus performs an overwrite operation by utilizing a change in power of the light pulse.

Figure 23:
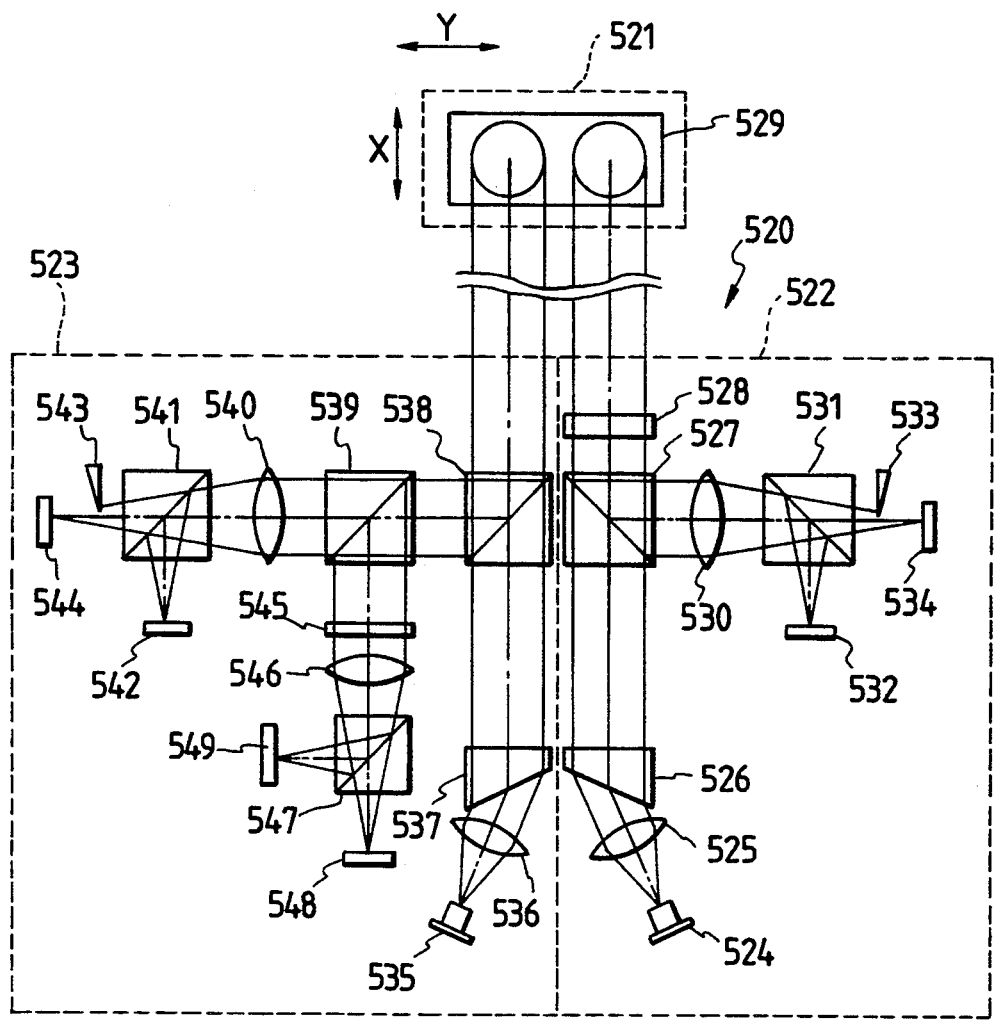
FIG. 23 is a view showing the second embodiment of an optomagnetic recording/reproducing apparatus according to the present invention.

FIG. 23 is a view showing the second embodiment of an optomagnetic recording/reproducing apparatus according to the present invention. Referring to FIG. 23, the optomagnetic recording/reproducing apparatus comprises a fixed optical system 520 fixed in the apparatus and a movable optical system 521 arranged to be radially moved along an optomagnetic disk (not shown). The fixed optical system 520 comprises a first optical head 522 and a second optical head 523. The first optical head 522 is used as an information recording head, and the second optical head 523 is used as a reproduction head or a head for performing immediate reproduction in the recording mode. The first optical head 522 comprises a semiconductor laser 524 serving as a recording light source, a collimator lens 525, a beam shaping prism 526, a polarizing beam splitter 527, and a λ/4 plate 528. A light beam from the semiconductor laser 524 is a linearly polarized light component (to be referred to as a P-polarized light component hereinafter) having the polarization direction parallel to the drawing surface. The polarizing beam splitter 527 transmits almost 100% of the P-polarized light component and reflects almost 100% of the linearly polarized light component (to be referred to as an S-polarized light component hereinafter) having the polarization direction perpendicular to the polarization direction of the P-polarized light component.

A light beam emitted from the semiconductor laser 524 is collimated by the collimator lens 525 and is shaped by the beam shaping prism 526 to have a circular section. This parallel beam passes through the polarizing beam splitter 527 and is polarized by the λ/4 plate 528 into a circularly polarized light beam. This beam emerges toward the movable optical system 521. A mirror 529 is arranged in the movable optical system 521, and the incident beam is reflected by the mirror 529 in a direction perpendicular to the drawing surface. The reflected beam is converged into a minute light spot by an objective lens (not shown) and is radiated on an optomagnetic disk (not shown). As described above, the light spot is formed on the information track of the optomagnetic disk. At the same time, a magnetic field is applied to the information track from a magnetic head(to be described later), thereby recording information. On the other hand, this light beam is reflected by the optomagnetic disk and is then incident on the polarizing beam splitter 527 through the objective lens, the mirror 529, and the λ/4 plate 528. In this case, the beam is polarized and returned to the S-polarized light component through the λ/4 plate 528. Since the polarizing beam splitter 527 reflects almost 100% of the S-polarized light component in accordance with its polarization characteristics, light reflected by the optomagnetic disk is guided to a half prism 531 through a condenser lens 530.

The incident beam is split into two beams by the half prism 531. One split beam is detected by a photodetector 532. A tracking error signal is generated on the basis of a detection signal from the photodetector 532, thereby performing autotracking control by a so-called push-pull method. By separating a tracking control signal frequency from the detection signal from the photodetector 532, track and sector addresses recorded by three-dimensional pits on the 10 information tracks are reproduced. The designated information track is searched on the basis of these pieces of address information, and the light beam is accessed to the target information track. On the other hand, the beam passing through the half prism 531 is detected by a photodetector 534 through a knife edge 533. Autofocusing control by a so-called knife edge method is performed on the basis of a detection signal from the photodetector 534.

The first optical head 522 generates only circularly polarized light because the first optical head 522 serves as only the recording head. For this reason, light returning to the semiconductor laser 524 can be prevented by a combination of the polarizing beam splitter 527 and the λ/4 plate 528. As compared with the conventional optomagnetic disk optical head for emitting linearly polarized light, light transmission efficiency from the semiconductor laser to the optomagnetic disk can be improved, and the maximum output from the semiconductor laser 524 can be reduced accordingly. Since the circularly polarized light is generated, and no optomagnetic signal is reproduced, the overall apparatus is rarely adversely affected by the birefringence of the substrate of the optomagnetic disk. Information recorded by the three-dimensional pit can be accurately reproduced even if the objective lens is not accurately moved in the radial direction of the optomagnetic signal.

The second optical head 523 will be described below. The second optical head 523 comprises a semiconductor laser 535 serving as a reproduction light source, a collimator lens 536, a beam shaping prism 537, and a polarizing beam splitter 538. The light beam from the semiconductor laser 535 is a P-polarized light component as in the first optical head 522. The polarizing beam splitter 538 has a P-polarized light component transmittance of 60%, a P-polarized light component reflectance of 40%, an S-polarized light component transmittance of almost 0%, and an S-polarized light component reflectance of almost 100%. The light beam from the semiconductor laser 535 is incident on the movable optical system 521 through the collimator lens 536, the beam shaping prism 537, and the polarizing beam splitter 538. This beam is reflected by the mirror 529 in the movable optical system 521 in a direction perpendicular to the drawing surface and is focused as a minute light spot on the optomagnetic disk by an objective lens (not shown). A beam reflected by the optomagnetic disk is returned to the polarizing beam splitter 538 in the second head 523 through the objective lens and the mirror 529 again. Part of the return beam is reflected toward a polarizing beam splitter 539.

The polarizing beam splitter 539 has polarization characteristics as a P-polarized light transmittance of 20%, a P-polarized light reflectance of 80%, an S-polarized light transmittance of almost 0%, and an S-polarized light reflectance of almost 100%. For this reason, part of the P-polarized light component is transmitted, and the remaining part of the P-polarized light component and the entire S-polarized light component are reflected by the polarizing beam splitter 539. The beam passing through the polarizing beam splitter 539 is guided to a control optical system constituted by a condenser lens 540, a half prism 541, photodetectors 542 and 544, and a knife edge 543. Servo error signals for focusing control and tracking control are generated on the basis of detection signals from photodetectors 542 and 544 in the same manner as the first optical head 522. Autotracking control by the push-pull method and autofocusing control by the knife edge method are performed on the basis of the resultant servo error signals. On the other hand, the polarization direction of the P- and S-polarized light beams reflected by the polarizing beam splitter 539 is rotated through 45° by a λ/2 plate 545 and is then incident on a polarizing beam splitter 547 through a condenser lens 546. The polarizing beam splitter 547 has a P-polarized light transmittance of almost 100%, a P-polarized light reflectance of almost 0%, an S-polarized light transmittance of almost 0%, and an S-polarized light reflectance of almost 100%. The beam incident on the polarizing beam splitter 547 is split into P- and S-polarized light components. The split P-polarized light component is detected by a photodetector 549, and the split S-polarized light component is detected by a photodetector 549. Detection outputs from the photodetectors 548 and 549 are supplied to a signal processing circuit (not shown). The two detection signals are differentially detected in the signal processing circuit to reproduce an optomagnetic signal. The optomagnetic signal further subjected to processing such as binarization and demodulation, thereby generating reproduction data. The signal processing circuit adds the detection signals from the photodetectors 548 and 549 to reproduce pieces of information such as track and sector addresses recorded in the form of three-dimensional pits on the optomagnetic disk. These pieces of information can be reproduced by the signals from the photodetectors in the control optical system as in the first optical head 522. The information track and sector are searched in accordance with the resultant pieces of address information.

Since the second optical head 523 is used for only reproduction, it must generate a light beam as a linearly polarized light beam on the optomagnetic disk. For this purpose, a semiconductor laser, the maximum output of which is small, can be used in the second optical head 523 because a high-power recording beam is not required although the semiconductor laser of the second optical head 523 has poorer light transmission efficiency from the semiconductor 535 to the optomagnetic disk than that of the first optical head 522 due to the characteristics of the polarizing beam splitter 538. Since the linearly polarized light is radiated and the optomagnetic signal is reproduced, the second optical head 523 is susceptible to the influence of the birefringence of the substrate of the optomagnetic disk. It is preferable to accurately move the objective lens in the radial direction of the optomagnetic disk. That is, it is preferable that the center of the optomagnetic disk is located on a line extending along the X direction of the objective lens of the second optical head 523, as shown in FIG. 23.

Figure 24:
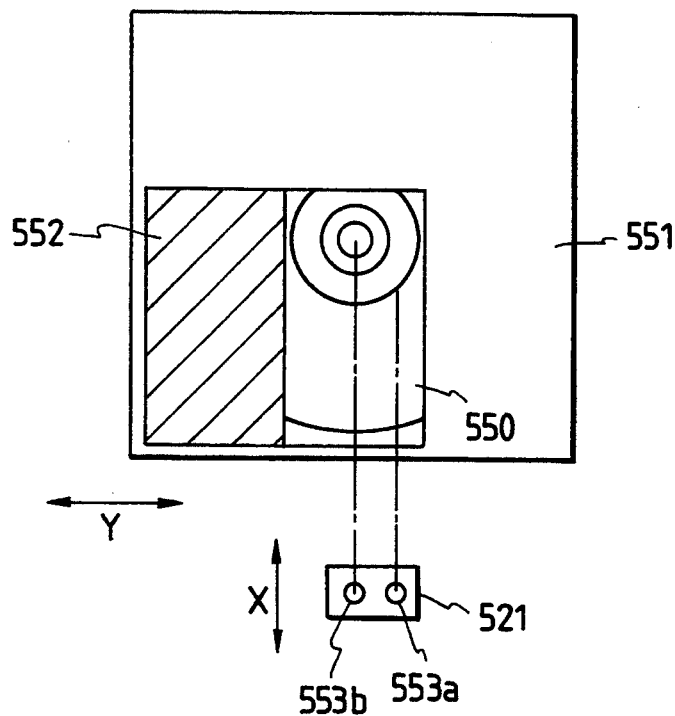
FIG. 24 is a plan view showing an optomagnetic disk and a movable optical system in the embodiment shown in FIG. 23.
Figure 25:
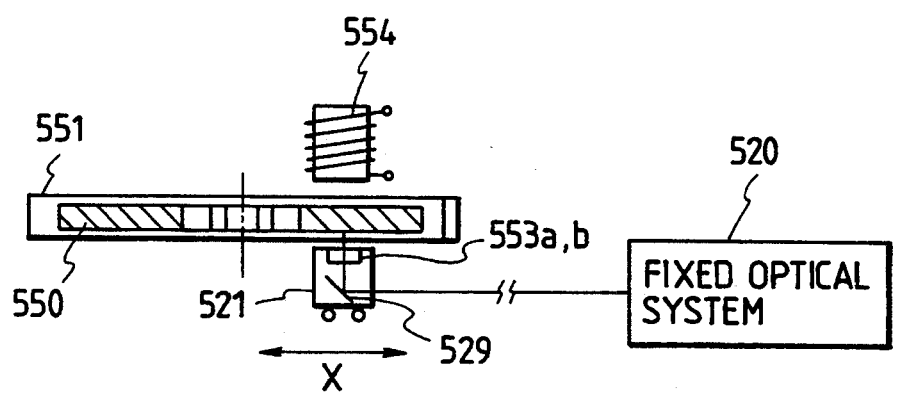
FIG. 25 is a side view of an optical system and a disk in the embodiment shown in FIG. 24.

FIG. 24 is a plan view showing the positional relationship between the optomagnetic disk and the movable optical system, and FIG. 25 is a side view thereof. Referring to FIGS. 24 and 25, an optomagnetic disk 550 (not shown in FIG. 23) has a protective case 551. An opening/closing shutter 552 is openably formed in part of the protective case 551. This opening/closing shutter 552 is kept open when the optomagnetic disk 550 is mounted in the apparatus. The optomagnetic disk 550 is rotated by a spindle motor (not shown) at a constant speed. Objective lenses 553a and 553b (not shown in FIG. 23) are mounted on the upper surface of a movable optical system 521 shown in FIG. 23. The objective lens 553a corresponds to the first optical head 522, and the objective lens 553b corresponds to the second optical head 523. Autofocusing and autotracking actuators (not shown) are connected to the objective lenses, so that autofocusing control and autotracking control can be independently performed. The objective lens 553b in the second optical head 523 is located such that the center of the optomagnetic disk 550 is located on the extension line, so that the light beam can be accurately moved in the radial direction of the optomagnetic disk 550.

As shown in FIG. 25, the movable optical system 521 is arranged to be moved in the radial direction (X direction) of the optomagnetic disk 550 by means of a linear motor or the like. The light beams emitted from the first and second optical heads 522 and 528 in the fixed optical system 520 are accessed to the target information tracks. In this case, the recording light spot from the first optical head 522 is projected on a forward position of the information track, and the reproduction light spot from the second optical head 523 is projected on a backward position spaced apart from the forward position by a predetermined distance. A magnetic head 554 is arranged above the upper surface of the optomagnetic disk 550 at a position opposite to the objective lenses 553a and 553b of the movable optical system 521. In this embodiment, information can be recorded in accordance with a magnetic field modulation method or optical modulation method. Recording is performed in accordance with the magnetic field modulation method. The magnetic head 554 generates a magnetic field modulated in accordance with the information signal and is applied to the optomagnetic disk 550. The recording light beam of the first optical head 522 is set to have a recording power having a predetermined intensity, as a matter of course. On the other hand, when recording is to be performed in accordance with the optical modulation method, the magnetic field from the magnetic head 554 is given as a magnetic field in a predetermined direction, and the recording light beam is intensity-modulated in accordance with the information signal. Since the two objective lenses of the optical heads and servo control actuators are mounted in the single movable optical system 521, the objective lenses 553 and 553b of the two optical heads can be located within the window (opening/closing shutter) of the conventional optomagnetic disk without increasing the drive space.

A detailed operation of this embodiment will be described below. First, a recording operation will be described. When information is to be recorded, the movable optical system 521 is moved in the radial direction of the optomagnetic disk 550 and is sought to a position near the information track designated by control of a controller (not shown). In the first and second optical heads 522 and 523, the recording and reproduction light spots of the two optical heads are positioned to the target information tracks while the track and sector addresses are being read in accordance with the above-mentioned operation. The light beam having a predetermined intensity and emitted from the first optical head 522 traces the information track, and at the same time the modulation magnetic field is applied from the magnetic head 554, thereby recording a series of pieces of information on the information track. On the other hand, the reproduction light beam emitted from the second optical head 523 is scanned following the recording light spot. The reflected light is sequentially detected in the second optical head 523, as described above. In the signal processing circuit, the recorded information is reproduced on the basis of the detection signal from the second optical head 523. That is, the information recorded with the recording light beam from the first optical head 522 is immediately reproduced with the reproduction light beam from the second optical head 523. The resultant reproduction data is sent to a verifying discrimination circuit (not shown) and is compared with the recording data, thereby performing a verifying operation. As a result of this operation, if a recording error exceeds a reference value, recording is performed again on the same track or another substituent track.

On the other hand, when information is to be reproduced, the movable optical system 521 is temporarily sought to a position near the designated information track, and thereafter, the movable optical system 521 is moved while the address information of the information track is read by the second optical head 523, thereby positioning the second optical head 523 at the target information track. The reproduction light beam from the second optical head 523 is scanned following the recording beam along the target information track. The reflected light is detected by the second optical head 523. Processing such as binarization and demodulation is performed in the signal processing circuit to reproduce the recorded information. The obtained reproduction data is sequentially externally transferred. In information reproduction, the first optical head 522 may cause the semiconductor laser 524 to turn off to reduce power consumption. Alternatively, the same information track or an information track adjacent thereto may be scanned with a light power having a low output.

In this embodiment, since the first optical head is used as the recording head to radiate circularly polarized light, the influence of the birefringence of the substrate of the optomagnetic disk can almost be eliminated. For this reason, the objective lens of the first optical head need not be accurately moved in the radial direction of the optomagnetic disk. It is possible to mount the two objective lenses on the same movable optical system to move the objective lens of the first optical head while being radially shifted along the disk. This indicates that the overall optical system can be made compact. In the first optical head, light returning to the semiconductor laser can be prevented, and the light transmittance can be set higher than that of the conventional arrangement. For this reason, the output power of the semiconductor laser can be reduced to reduce the cost. In addition, since the first optical head reproduces the three-dimensional pits, the birefringence allowance of the optical elements in the first optical head can be increased to reduce the cost. Since the semiconductor laser of the second optical head does not have a high recording output, but can have a low reproduction output, the overall cost can be reduced. In addition, since the objective lenses of the two optical heads and the actuators are mounted on the single movable optical system, the objective lenses of the two optical heads can be arranged within the conventional window without increasing the size of the window of the optomagnetic disk.

Figure 26:
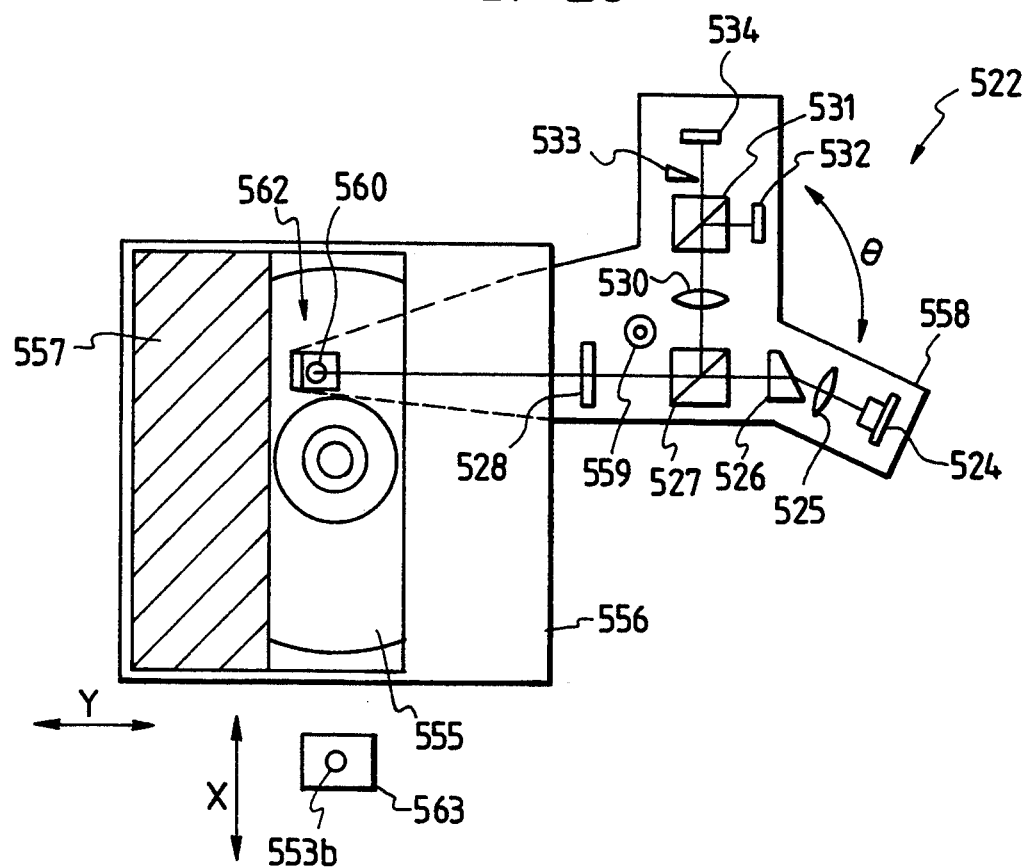
FIG. 26 is a plan view showing an arrangement when the first optical head in the embodiment in FIG. 23 is of a rotary moving type.
Figure 27:
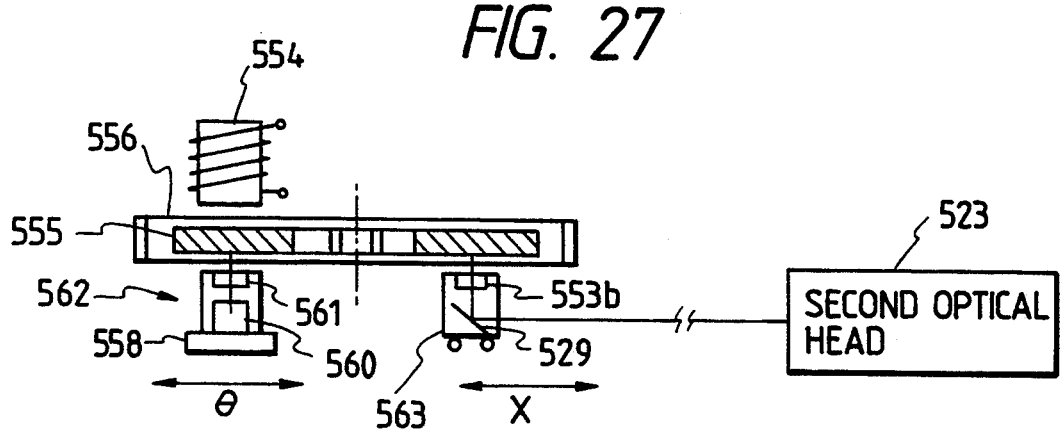
FIG. 27 is a side view of a system shown in FIG. 26.

FIG. 26 is a plan view showing a modification of a head unit, and FIG. 27 is a side view thereof. In the embodiment shown in FIG. 23, the objective lenses of the two optical heads and their drive actuators are mounted on the single movable optical system. However, when the size of the optomagnetic disk is reduced from 5.25" to 3.5" or less, the curvature of the track in the inner circumferential portion of the disk is increased, and the drive ranges of the objective lenses in the tracking direction must be increased, thus limiting the freedom in design. In addition, since the window of the protective case is reduced, the actuator for each objective lens must be made compact. In order to solve these drawbacks for a compact optomagnetic disk, the movable optical system is separated into two movable optical systems respectively corresponding to the first and second optical heads. The modification of FIG. 26 will be described in detail below. Referring to FIG. 26, an optomagnetic disk 555 comprises a compact 3.5" disk. The optomagnetic disk 555 has a protective case 556 having an opening/closing shutter 557. When the optomagnetic disk 555 is mounted in the apparatus main body, the central portion of the opening/closing shutter 557 is fully open, as shown in FIG. 26. A base 558 is pivotal about a pivot shaft 559 in the range of a predetermined angle Θ. A first optical head 522 for recording only is mounted on the base 558.

A movable optical system 562 comprising a mirror 560 for reflecting the recording light beam from the first optical head 522 toward the optomagnetic disk 555, an objective lens 561 for focusing the recording light beam into a minute light spot, and an actuator (not shown) for driving the objective lens 561 is mounted at the distal end of a projection extending from the base 558 on the lower surface side of the optomagnetic disk 555. With this structure, the base 558 is pivoted about the pivot shaft 559 by driving a motor or the like, and the movable optical system 562 is moved in the radial direction of the optomagnetic disk 555. The movable optical system 562 is positioned at the target information track, and the recording light beam emitted from the first optical head 522 is radiated on the target information track. Note that the optical head 554 is located to oppose the movable optical system 562 corresponding to the recording first optical head 522. A movable optical system 563 corresponds to the second optical head 523. A mirror 529, an objective lens 553b, and its drive actuator which correspond to the second optical head 523 shown in FIGS. 24 and 25 are mounted on the movable optical system 563. This movable optical system 563 is moved by driving of a linear motor or the like in the radial direction (X direction) of the optomagnetic disk 555 in the same manner as in the movable optical system 521. The reproduction light beam from the second optical head 523 is radiated on the target information track.

In this embodiment, when information is to be recorded, the two optical heads are independently accessed. In the first optical head 522, the base 558 is pivoted to radially move the movable optical system 562 along the disk, so that the recording light beam is radiated on the target information track. At the same time, the movable optical system 563 is radially moved along the disk to position the reproduction light beam from the second optical head 523 to the same information track. The recording optical beam and then the reproduction light beam are sequentially scanned, as a matter of course. Upon radiation of the recording light beam and application of the magnetic field from the magnetic head 554, the information is recorded in the target information track. The recorded information is then reproduced with the reproduction light beam. The resultant reproduction data is compared with the recording data, thereby performing a verifying operation. On the other hand, when information is to be reproduced, only the second optical head 523 is accessed to position the movable optical system 563 at the target information track. Only the reproduction light beam is scanned along the information track to read out the recorded information. Note that the first optical head 522 and the movable optical system 562 are kept stationary at the predetermined position. As described above, by using the two movable optical systems, the drive ranges of the objective lenses are not limited to a specific one, thereby properly performing tracking control with a compact optomagnetic disk. The movable optical system is moved along a periphery of a circle having the center as the pivot shaft 559. As described above, the circularly polarized light is used as the recording light beam, and the objective lens need not be accurately moved in the radial direction of the disk. No problem is posed by this circular movement.

The embodiments described above have the following effects.

(1) Since a semiconductor laser is driven by utilizing dynamic wavelength switching characteristics based on the dynamics of the semiconductor laser carriers of the semiconductor laser, light having respective wavelength can be detected with a minimum crosstalk, and a high-quality signal having a high SN ratio can be obtained. Therefore, a high-density format of information can be achieved in the fields of optical information recording, transmission, processing, and measurement.

(2) Since a plurality of light beams having different wavelengths obtained utilizing the dynamic wavelength switching characteristics of the semiconductor laser are projected on the same or different information tracks as recording and reproduction light beams, recording and reproduction can be effectively performed such that recording and verifying operations on the same information track can be performed or recording and reproduction on a plurality of information tracks can be simultaneously performed.

(3) Since light beams having different wavelengths are transmitted as light information signals and information for the sync clock signal through an optical fiber, the information signal transmitted in synchronism with the sync clock can be demodulated in information demodulation. The transmitted information can be accurately demodulated regardless of jitter components generated during transmission through the optical fiber.

(4) Each of the light beams from a plurality of light sources is split into 0th- and 1st-order diffracted components, and the split light components are radiated as the main light spots and the sublight spots. Information is recorded with each main light spot of the corresponding information track, and the recorded information is reproduced with the corresponding sublight spot, thereby recording pieces of information in the plurality of information tracks and hence performing a direct verifying operation. Therefore, an immediate verifying operation can be performed while a large quantity of information is being recorded, thereby greatly reducing the information recording time as compared with the conventional case.

(5) Since the diffraction grating and the image rotating element are slightly rotated about their optical axes on the basis of the corresponding tracking error signals, tracking control of the plurality of light spots projected on the plurality of corresponding information tracks can be performed. Even if the plurality of light spots are projected on the plurality of corresponding information tracks, the light spots accurately trace the information tracks, thereby stably recording and reproducing the information.

(6) Since the first optical head as the information recording head and the second optical head as the information reproduction head are arranged as optical heads, and information is recorded with the circularly polarized light from the first optical head, the influence of the birefringence of the substrate of the recording medium is almost eliminated. Therefore, since the light spot need not be accurately moved in the radial direction of the recording medium, the structural limitations of the optical system can be eliminated, and a compact optical system can be provided.

Figure 28:
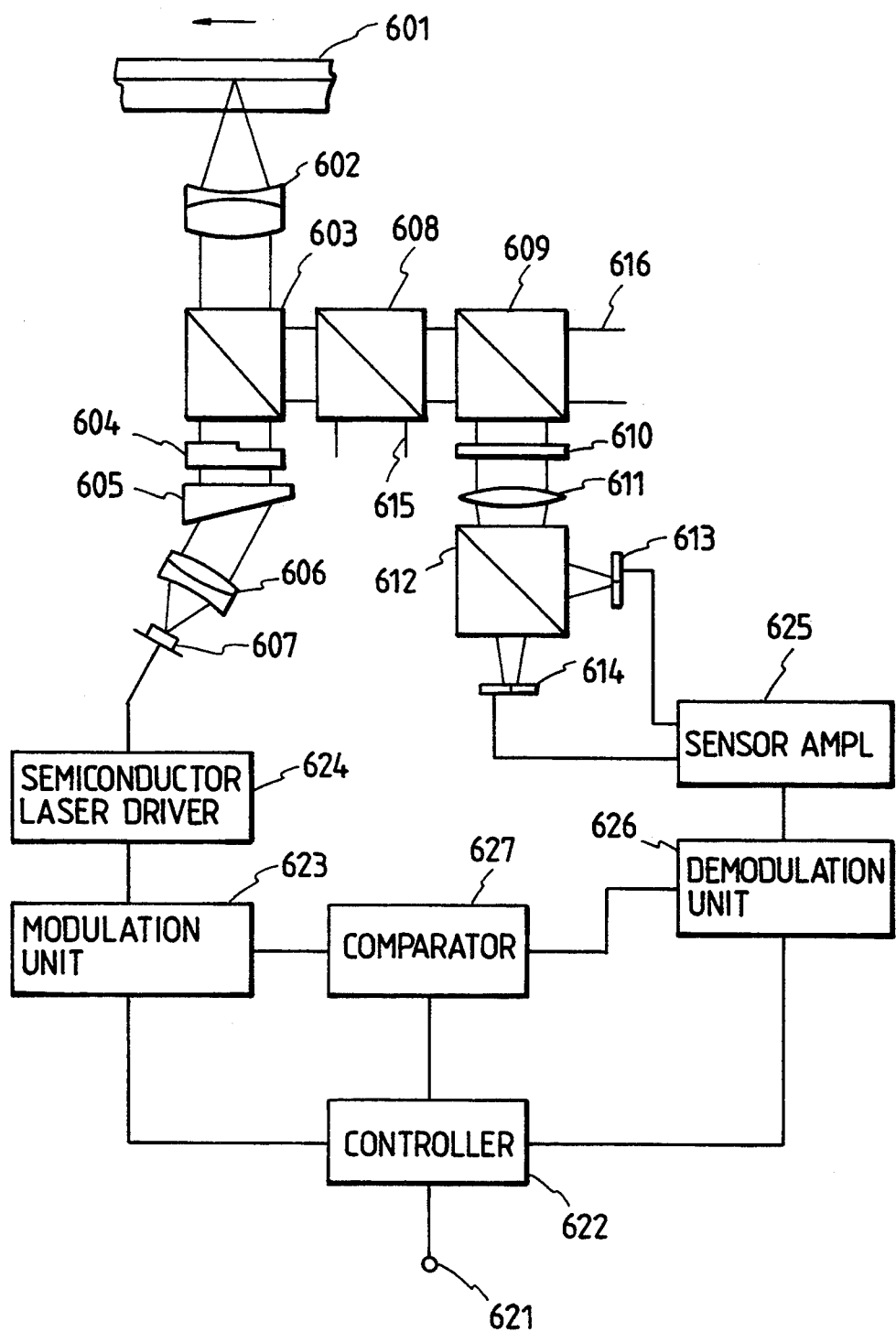
FIG. 28 is a view showing the fourth embodiment of an optical information recording/reproducing apparatus according to the present invention.

FIG. 28 is a view showing the fourth embodiment of an optical information recording/reproducing apparatus according to the present invention. Referring to FIG. 28, the optical information recording/reproducing apparatus records or reproduces information on or from an optomagnetic disk 601 and includes an achromatic pickup lens 602, a polarizing beam splitter 603, a phase element 604 serving as an optical element having a stepped edge, an achromatic beam shaping prism 605, an achromatic collimator lens 606, a two-wavelength semiconductor laser 607, a dichroic prism 608, a beam splitter 609, a λ/2 plate 610, an RF sensor lens 611, an RF polarizing beam splitter 612, two-divided RF sensors 613 and 614, an information input/output terminal 621, a controller 622, a modulation unit 623, a semiconductor laser driver 624, an RF sensor amplifier 625, a demodulation unit 626, and a comparator 627.

The two-wavelength semiconductor laser 607 has the same arrangement as described with reference to the previous embodiment of FIGS. 3 and 4 and is driven in the same manner as described with reference to FIGS. 10 and 11A to 11D.

Light (wavelengths $\lambda_1$ and $\lambda_2$) from the two-wavelength semiconductor laser 607 is collimated into a parallel beam by the collimator lens 606 and is shaped by the prism 605 such that the sectional shape is of a true circle. A beam having the wavelength $\lambda_1$ has a spatial phase difference distribution by means of the phase element 604 (to be described in detail later).

The light having the wavelengths $\lambda_1$ and $\lambda_2$ and having passed through the polarizing beam splitter 603 is changed by the pickup lens 602 such that a normal minute spot having the wavelength $\lambda_2$ and a spot for the wavelength $\lambda_1$ having an asymmetrical light amount distribution (to be described later) are formed on the recording surface of the optomagnetic disk 601.

The 30% P- and 100% S-polarized light components contained in the light reflected by the optical disk 601 are reflected by the polarizing beam splitter 603 and are guided to the detection optical system. A $\lambda_2$ wavelength beam 615 is further reflected by the dichroic prism 608, while a $\lambda_1$ wavelength beam passes through the prism 608.

The $\lambda_1$ wavelength beam is further split into an AT/AF detection system (not shown) beam 616 (transmitted beam) and an RF detection system (reflected beam) by the RF beam splitter 609. The RF detection system beam is detected by the λ/2 plate 610, the lens 611, the polarizing beam splitter 612, and the two-divided sensors 613 and 614.

Referring to FIG. 28, data to be recorded, input from the terminal 621, is recognized as the recording data by the controller 622. By a seek mechanism (not shown), the light spot is accessed to a target data recording region on the optical disk 601. A physical address, a logical address, and the enable/disable state of recording on the optical disk 601 are confirmed.

The controller 622 sends the data to the modulation unit 623 and converts it into an optical disk format. A header, an ECC, and the like are added to this optical disk format, and the information is modulated into a binary signal in accordance with a predetermined modulation method. A waveform shown in FIG. 11A is sent to the laser driver 624.

In addition, this waveform is converted into an injection current waveform (FIG. 11B) by the laser drive 624, thereby driving the laser 607.

As a result, as described above, a $\lambda_2$ recording light output waveform (FIG. 11D) modulated with a light output O,P$_W$ corresponding to the data to be recorded, and a $\lambda_1$ output waveform (FIG. 11C) having a predetermined reproduction output P$_R$ regardless of modulation can be obtained.

The light having the wavelength $\lambda_1$ from the laser is phase-shifted by the phase shifter 604 and is formed into a spot having a light amount distribution asymmetrical on the disk 601 with respect to the track direction.

Figure 29A:
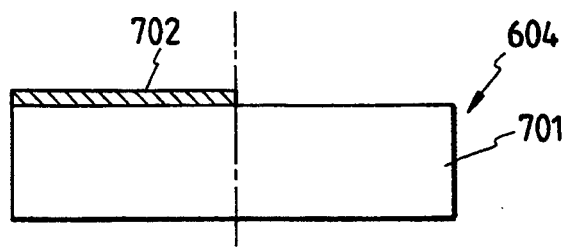
FIGS. 29A to 29D are views showing a phase element structure and light spot shapes in the embodiment shown in FIG. 28.

The phase element 604 is an optical element having a stepped edge, as disclosed in Japanese Laid-Open Patent Application No. 3-268252 (corresponding to U.S. Ser. No. 670,253 filed on Mar. 15, 1991). In this embodiment, for example, the phase element 604 has a structure in which a transparent dielectric 702 is deposited on an optically transparent substrate 701, as shown in FIG. 29A. If refractive indices of the dielectric 702 at wavelengths $\lambda_1$ and $\lambda_2$ are defined as $n_1$ and $n_2$, respectively and the thickness of the dielectric 702 is defined as d, the following equations are obtained:

$$2\pi(n_1-1)d/\lambda_1=(2m_1+1)\pi \tag{1}$$

$$2\pi(n_2-1)d/\lambda_2 = 2m_2\pi \quad (2)$$

for ($m_1$, $m_2 = 0, 1, 2, 3, \ldots$)

Figure 29B:
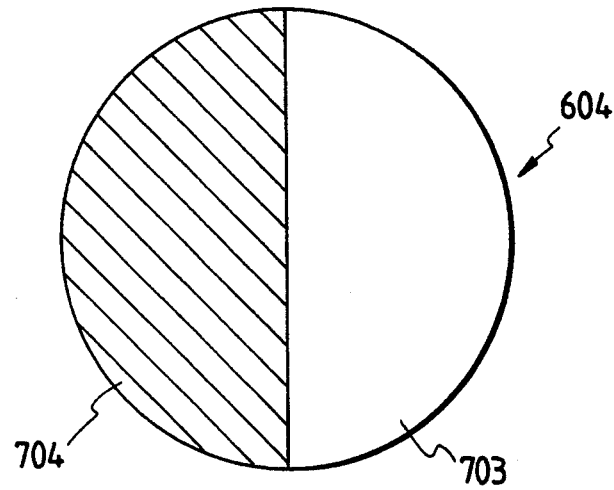

The wave surface of the $\lambda_1$ wavelength beam passing through the phase element 604 is shifted by a phase difference $\pi$ between the regions 703 and 704 shown in FIG. 29B. However, the wave surface of the $\lambda_2$ beam receives zero phase difference caused by the two regions 703 and 704.

Diffraction on the wave surface phase-shifted by this stepped edge is taken into consideration. The shape of the $\lambda$ light spot on the optical disk 601 has a light amount distribution 405 shown in FIG. 29C. That is, as compared with a spot 706 free from the influence of phase shifting, the distribution 405 is asymmetrical in a direction perpendicular to the edge (division line), and the dip position of the distribution 405 is shifted from the optical axis.

Figure 29C:
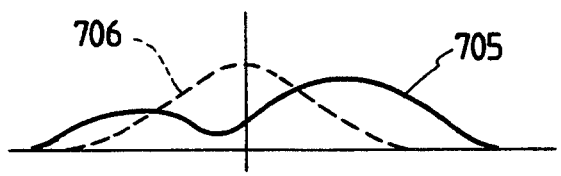

According to an analysis result in the Fourier optics using scalar values approximated under the boundary conditions of Kirchhoff, the dip portion drops to a zero light amount in a symmetrical portion. However, according to a more strict experimental analysis (the Helmholtz wave equation is solved using a boundary element method as a numerical analysis), a light amount distribution shown in FIG. 29C is obtained.

Figure 29D:
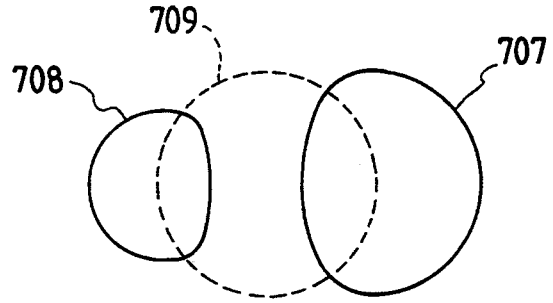

Two-dimensional spot shapes are illustrated in FIG. 29D. As compared with a spot 709 free from phase shifting, the phase-shifted spot appears as two spots, i.e., large and small spots 707 and 708.

This method has a minimum influence of wavelength variations as compared with a spot splitting method using a conventional wavelength dispersion element. Therefore, the $\lambda_1$ wavelength spots 708 and 707 shifted in the track direction are obtained as compared with the $\lambda_2$ wavelength spot 709 having the wave surface having no relative phase difference.

Data is written with the preceding $\lambda_2$ wavelength spot 709 on the track of the optical disk 601, and data directly written is read with the subsequent $\lambda_1$ wavelength light spot to confirm whether the data is correctly written, i.e., the verifying operation can be performed by one path. As compared with the conventional method for switching between the write access and the verifying operation every rotation, the total throughput of the write speed can be greatly increased, thereby achieving high-speed access at a high transfer rate.

The two spots 707 and 708 can be separated by the two-divided sensors 613 and 614 divided in the track direction, as shown in FIG. 28.

The spot 708 preceding the recording spot 709 can have a pilot spot function of confirming the defect of the recording medium, erasure of the previous data, and the state prior to write access, and a preheat function of preheating the irradiated portion.

When detection is not required, the two-divided sensors 613 and 614 are used as nondivided sensors, and the shapes and sizes of the light-shielding mask and sensor are optimized, the crosstalk components are reduced to detect only the information of the spot 707.

The verifying signal thus read is subjected to waveform shaping such as photoelectric current-to-voltage conversion in the sensor amplifier 625, in-phase noise reduction by a differential operation, amplification, and filtering, and is then converted into a binary signal. Normal reproduction processes such as ECC decoding check in the demodulation unit 626 are performed, and the information is decoded and reproduced into the original information.

The resultant data is compared with data to be written by the comparator 627, and a signal representing the end of normal write access or that rewriting is required is sent back to the controller 622 in accordance with the type of error and the level. Therefore, the controller 622 executes necessary processing.

In the normal reproduction mode, modulation is stopped by a signal from the controller 622. The output from the modulation unit 623 is set at "Low" level to emit only the $\lambda_1$ wavelength light. The output from the demodulation unit 626 is not subjected to the verifying operation through the comparator 627 and is output from the terminal 621.

Figure 30:
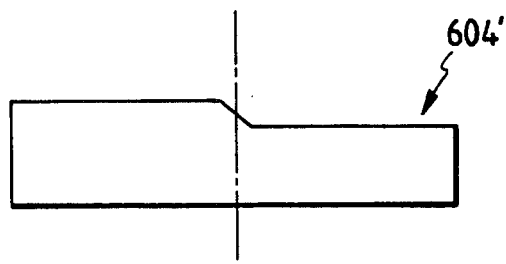
FIG. 30 is a view showing another arrangement of a phase element used in the embodiment of FIG. 28.

FIG. 30 shows another arrangement of a phase element used in the present invention. A phase element 604' shown in FIG. 30 is designed for improving mass production as compared with the above embodiment. Although the phase difference is obtained by deposition in the embodiment shown in FIG. 29A, a stepped element is integrally formed by glass molding. The step satisfies equations (1) and (2) when refractive indices of glass are given as $n_1$ and $n_2$.

Note that resin molding may be performed if the birefringence is small.

In the structure shown in FIG. 30, the stepped portion is not constituted by a vertical surface but an inclined surface so as to facilitate removal of the molded body. Although the inclined surface may reduce asymmetry, it is found that the inclined surface does not adversely affect the verifying operation.

A method of selecting an angle of the stepped edge is a method of controlling this asymmetry. The angle of a surface inclined in a direction opposite to that of FIG. 30 may be selected. A method of depositing a conductive material such as a metal on only the inclined portion may be employed.

In the above embodiment, as shown in equation (1), the $\lambda_1$ wave surface has a phase difference $\pi$, i.e., a step of $\lambda/2$. However, the asymmetric spot formation method using the wave surface diffraction according to the present invention has a characteristic feature in that the influence of the variation in wavelength on the spot light amount distribution is smaller than that of the method of splitting the beam into the $\lambda_1$ and $\lambda_2$ wavelength beams using the wavelength dispersion element such as a prism or a diffraction grating. This indicates that precision of forming the step or giving the phase difference is less strict. The economical advantage of the phase element 604 is obtained as compared with the prism or diffraction grating.

In the above embodiment, the step of the phase element 604 is aligned with the optical axis. However, if the step of the phase element 604 is shifted from the optical axis on the order of several hundreds of $\mu m$, the shape of the resultant spot is not greatly changed according to the experiment. That is, in assembly or adjustment precision, the method of FIG. 30 is more advantageous than the method using the prism or grating.

Strictly speaking, asymmetry of the $\lambda_2$ wavelength spot shape can be obtained by a phase difference as an integer multiple of $2\pi$ given to the $\lambda_2$ wave surface represented by equation (2). However, an almost symmetrical arrangement near the optical axis can be obtained, thus posing no problem.

A stepped edge optical element for giving a λ/2 difference in optical path length to a specific wavelength and giving a difference in optical path length to other wavelengths by an integer multiple of the wavelength is arranged in the beam having a plurality of wavelengths. An asymmetrical light amount distribution is given to the beam and spot having at least the specific wavelength, and the beam and spot having the specific wavelength are split from those having other wavelengths. Therefore, the beam and light spots can be split or separated with a small influence of wavelength variations and a minimum crosstalk between the wavelengths.

For this reason, management of longitudinal mode characteristics of the oscillation wavelength of the light source and wavelength stability can be relaxed. Precision in assembly and adjustment can be less strict than the conventional case.

For this reason, the manufacture can be facilitated, the cost can be reduced, and reliability can be improved.

Unlike the dispersion element, since the beam need not be diverged in the angular direction, a compact, lightweight arrangement can be achieved.

The present invention is not limited to the particular embodiments described above. Various changes and modifications may be made. All these applications can be incorporated in the present invention without departing from the scope of the appended claims.

What is claimed is:

1. An optical information recording/reproducing apparatus comprising:
   a semiconductor laser, having an active layer comprising at least two light-emitting layers having different energy levels, for generating first and second light beams having different wavelengths;
   a wavelength dispersion element for dispersing the first and second light beams generated by said semiconductor laser; and
   an optical system for converging the first and second light beams dispersed by said wavelength dispersion element to form first and second light spots on a track of a recording medium at a predetermined interval,
   wherein information is recorded on the track with the first light spot, and just after recording the information recorded on the track is reproduced with the second light spot.

2. A semiconductor laser device comprising:
   a semiconductor laser having an active layer comprising of at least two light-emitting layers having different energy levels;
   a signal generating circuit for generating a high-frequency signal having a predetermined frequency;
   a modulation circuit for modulating a signal width of the high-frequency signal generated by said signal generating circuit, in accordance with an information signal; and
   a drive circuit for driving said semiconductor laser in accordance with the signal modulated by said modulation circuit.

3. A device according to claim 2, wherein the predetermined frequency of the high-frequency signal is not less than twice a maximum value of a frequency of the information signal.

4. An optical information recording/reproducing apparatus comprising;
   a semiconductor laser, having an active layer comprising at least two light-emitting layers having different energy levels, for generating first and second light beams having different wavelengths;
   a signal generating circuit for generating a high-frequency signal having a predetermined frequency;
   a modulation circuit for modulating a signal width of the high-frequency signal generated by said signal generation circuit, in accordance with an information signal;
   a drive circuit for driving said semiconductor laser with the signal modulated by said modulation circuit;
   a wavelength dispersion element for dispersing the first and second light beams generated by said semiconductor laser; and
   an optical system for converging the first and second light beams dispersed by said wavelength dispersion element to form first and second light spots on a track of a recording medium at a predetermined interval,
   wherein information is recorded on the track with the first light spot, and just after recording the information recorded on the track is reproduced with the second light spot.

5. An apparatus according to claim 4, wherein the predetermined frequency of the high-frequency signal is not less than twice a maximum value of a frequency of the information signal.

6. An optical communication apparatus comprising:
   a semiconductor laser, having an active layer comprising of at least two light-emitting layers having different energy levels, for generating first and second light beams having different wavelengths;
   a signal generating circuit for generating a high-frequency signal having a predetermined frequency;
   a modulation circuit for modulating a signal width of the high-frequency signal generated by said signal generating circuit, in accordance with an information signal;
   a drive circuit for driving said semiconductor laser in accordance with the signal modulated by said modulation circuit, said semiconductor laser being driven by said drive circuit to generate a first light beam modulated by an information signal and a second light beam modulated at a predetermined period, and the first and second light beams having different wavelengths;
   a transmission line for transmitting the first and second light beams;
   first and second sensors for respectively detecting the first and second light beams transmitted through said transmission line;
   a clock generating circuit for generating a reference clock on the basis of an output signal from said second sensor; and
   a demodulation circuit for demodulating the information signal from an output signal from said first sensor, in synchronism with the reference clock generated by said clock generating circuit.

7. An apparatus according to claim 6, wherein the predetermined frequency of the high-frequency signal is not less than twice a maximum value of a frequency of the information signal.

8. An optical information recording/reproducing apparatus comprising:
   a semiconductor laser, having an active layer comprising at least two light-emitting layers having different energy levels, for generating first and second light beams having different wavelengths;

an optical element having a stepped edge for splitting the first and second light beams generated by said semiconductor laser, said optical element causing a difference between an optical path of light passing through one side of said edge and an optical path of light passing through the other side of said edge, and the difference being almost ½ one of the wavelengths of the first and second light beams and being substantially an integer multiple of the other of the wavelengths; and an optical system for converging the first and second light beams dispersed by said optical element to form first and second light spots on a track of a recording medium at a predetermined interval, wherein information is recorded on the track with the first light spot, and just after recording the information recorded on the track is reproduced with the second light spot.

9. An apparatus according to claim 8, wherein a light amount distribution of at least one of the first and second light spots is asymmetrical in a direction perpendicular to a ridge of said edge of said optical element.

10. An apparatus according to claim 8, wherein said optical element comprises a transparent glass plate having a stepped surface.

11. An apparatus according to claim 8, wherein said optical element comprises a transparent substrate having a surface on which a transparent dielectric is partially deposited.

12. A beam splitting device comprising:

a light source for generating first and second light beams having different wavelengths; and an optical element having a stepped edge for splitting the first and second light beams generated by said light source, said optical element causing a difference between an optical path of light passing through one side of said edge and an optical path of light passing through the other side of said edge, and the difference being almost ½ one of the wavelengths of the first and second light beams and being substantially an integer multiple of the other of the wavelengths.

13. A device according to claim 12, wherein a light amount distribution of at least one of the first and second light spots is asymmetrical in a direction perpendicular to a ridge of said edge of said optical element.

14. A device according to claim 12, wherein said optical element comprises a transparent glass plate having a stepped surface.

15. A device according to claim 12, wherein said optical element comprises a transparent substrate having a surface on which a transparent dielectric is partially deposited.

16. An optomagnetic recording/reproducing apparatus comprising:

a plurality of light sources;

a diffraction grating for splitting each of light beams emitted from said light sources into 0th- and 1st-order diffracted light components;

an optical system for converging the 0th- and 1st-order diffracted light components of the plurality of light beams diffracted by said diffraction grating to form a main light spot and a sublight spot on each of a plurality of tracks of an optomagnetic recording medium;

magnetic field applying means for applying an A.C. magnetic field having a predetermined frequency on a medium portion irradiated with the main light spot; and driving means for pulse-driving said plurality of light sources with the signal modulated in accordance with an information signal, wherein information is recorded on each track with each main light spot and at the same time the information recorded on each track is reproduced with each sublight spot.

17. An apparatus according to claim 16, further comprising detecting means for detecting a tracking error signal from reflected light of one of the main light spots, and control means for performing tracking control of all the main light spots and all the sublight spots in accordance with the tracking error signal detected by said detecting means.

18. An apparatus according to claim 16, further comprising detecting means for detecting a tracking error signal from reflected light of the sublight spot, and pivoting means for pivoting a diffraction grating about an optical axis in accordance with the tracking error signal detected by said detecting means.

19. An apparatus according to claim 16, further comprising an image rotating element disposed in an optical path extending from said light source to said medium, detecting means for detecting a tracking error signal from reflected light of the main light spot, and pivoting means for pivoting said image rotating element about an optical axis in accordance with the tracking error signal detected by said detecting means.

20. An optomagnetic recording/reproducing apparatus according to claim 16, wherein said plurality of light sources comprise a semiconductor laser which includes an active layer comprising at least two light-emitting layers having different energy levels and which emits the first and second light beams having different wavelengths.

21. An optomagnetic recording/reproducing apparatus comprising:

a first optical head for generating a first light beam of circular polarization;

a second optical head for generating a second light beam of linear polarization;

an optical system for focusing the first and second light beams to form first and second light spots on each of a plurality of tracks formed in parallel on an optomagnetic recording medium; and moving means for moving said optical system across tracks, wherein information is recorded on a track with the first light spot and at the same time the information recorded on the track is reproduced with the second light spot.

22. An apparatus according to claim 21, wherein said optical system comprises a first objective lens for focusing the first light beam and a second objective lens for focusing the second light beam, and said moving means comprises actuators for driving said first and second objective lenses, respectively.

* * * * *

UNITED STATES PATENT AND TRADEMARK OFFICE
CERTIFICATE OF CORRECTION

PATENT NO. : 5,365,535

DATED : November 15, 1994

INVENTOR(S) : EIJI YAMAGUCHI, et al.

It is certified that error appears in the above-indentified patent and that said Letters Patent is hereby corrected as shown below:

ON THE COVER PAGE item [56] Reference Cited

FOREIGN PATENT DOCUMENTS

"38-211787  9/1963 Japan.
 3268252  11/1991 Japan.
 4291045  10/1992 Japan." should read
--63-211787  9/1988 Japan.
 3-268252  11/1991 Japan.
 4-291045  10/1992 Japan.--.

IN THE DRAWINGS

SHEET 6, FIG. 9

Fig. 9, "REORDING" should read --RECORDING--.

COLUMN 4

Line 6, "track-with" should read --track with--.

COLUMN 8

Line 57, "60Åπthick" should read --60 Å thick--.

UNITED STATES PATENT AND TRADEMARK OFFICE
CERTIFICATE OF CORRECTION

PATENT NO. : 5,365,535

DATED : November 15, 1994

INVENTOR(S) : EIJI YAMAGUCHI, et al.

It is certified that error appears in the above-indentified patent and that said Letters Patent is hereby corrected as shown below:

COLUMN 10

Line 10, "nigh-frequency" should read --high-frequency--.

COLUMN 11

Line 9, "scans" should read --scan--.

COLUMN 20

Line 60, "Jitter" should read --jitter--.
Line 65, "Jitter" should read --jitter--.

COLUMN 21

Line 4, "Jitter" should read --jitter--.

COLUMN 24

Line 67, "arranged" should read --arranged in--.

COLUMN 41

Line 50, "of" should be deleted.
Line 66, "comprising;" should read --comprising:--.

UNITED STATES PATENT AND TRADEMARK OFFICE
CERTIFICATE OF CORRECTION

PATENT NO. : 5,365,535

DATED : November 15, 1994

INVENTOR(S) : EIJI YAMAGUCHI, et al.

It is certified that error appears in the above-indentified patent and that said Letters Patent is hereby corrected as shown below:

<u>COLUMN 42</u>

Line 30, "of" should be deleted.

Signed and Sealed this

Eleventh Day of July, 1995

Attest:

BRUCE LEHMAN

Attesting Officer     Commissioner of Patents and Trademarks